US012635139B2

(12) United States Patent
Park et al.

(10) Patent No.: US 12,635,139 B2
(45) Date of Patent: May 19, 2026

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Kyeonghoon Park, Suwon-si (KR); Juseong Min, Suwon-si (KR); Jaebok Baek, Suwon-si (KR); Donghyuck Jang, Suwon-si (KR); Sanghun Chun, Suwon-si (KR); Jeehoon Han, Suwon-si (KR); Taeyoon Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 415 days.

(21) Appl. No.: 18/177,335

(22) Filed: Mar. 2, 2023

(65) Prior Publication Data

US 2024/0032298 A1 Jan. 25, 2024

(30) Foreign Application Priority Data

Jul. 22, 2022 (KR) ........................ 10-2022-0091321

(51) Int. Cl.
*H10B 43/40* (2023.01)
*G11C 5/06* (2006.01)
(Continued)

(52) U.S. Cl.
CPC .............. *H10B 43/40* (2023.02); *G11C 5/06* (2013.01); *H01L 23/5226* (2013.01);
(Continued)

(58) Field of Classification Search
CPC ........ H10B 41/40; H10B 41/50; H10B 43/40; H10B 43/50; H10B 41/10; H10B 41/27;
(Continued)

(56) References Cited

U.S. PATENT DOCUMENTS 9,431,415 B2 8/2016 Shin et al.
10,930,664 B2 2/2021 Son et al.
(Continued)

FOREIGN PATENT DOCUMENTS

KR 10-2021-0023291 A 3/2021
KR 10-2021-0125152 A 10/2021
KR 10-2021-0136459 A 11/2021

OTHER PUBLICATIONS

Office Action in Korean Appln. No. 10-2022-0091321, mailed on Mar. 9, 2026, 14 pages (with English translation).

*Primary Examiner* — Christine S. Kim
*Assistant Examiner* — Andrew Victor Prostor
(74) *Attorney, Agent, or Firm* — Fish & Richardson P.C.

(57) ABSTRACT

A semiconductor device includes a peripheral circuit structure including circuits, wiring layers, and via contacts, a plate common source line covering the peripheral circuit structure, an insulating plug passing through the plate common source line, a lateral insulating spacer between the peripheral circuit structure and the plate common source line, a memory stack structure including gate lines on the plate common source line, a through contact passing through at least one of the gate lines and the insulating plug, the through contact being connected to a first via contact of the via contacts, and a source line contact passing through the lateral insulating spacer, the source line contact being between a second via contact of the via contacts and the plate common source line, wherein a width of the first via contact is greater than a width of the insulating plug in a lateral direction.

17 Claims, 40 Drawing Sheets

(51) Int. Cl.

| | |
|---|---|
| *H01L 23/522* | (2006.01) |
| *H01L 23/528* | (2006.01) |
| *H10B 41/10* | (2023.01) |
| *H10B 41/27* | (2023.01) |
| *H10B 41/35* | (2023.01) |
| *H10B 41/40* | (2023.01) |
| *H10B 43/10* | (2023.01) |
| *H10B 43/27* | (2023.01) |
| *H10B 43/35* | (2023.01) |

(52) U.S. Cl.
CPC ......... *H01L 23/5283* (2013.01); *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02)

(58) Field of Classification Search
CPC ........ H10B 41/35; H10B 43/10; H10B 43/27; H10B 43/35; H10B 43/20; G11C 5/06; G11C 5/025; H01L 23/5226; H01L 23/5283

See application file for complete search history.

(56) References Cited

U.S. PATENT DOCUMENTS

| | | | |
|---|---|---|---|
| 10,991,717 B2 | 4/2021 | Baek | |
| 11,342,262 B2 | 5/2022 | Kim et al. | |
| 11,417,672 B2 | 8/2022 | Lee | |
| 2016/0149049 A1* | 5/2016 | Sharangpani | H10B 43/10 |
| | | | 257/314 |
| 2021/0313341 A1 | 10/2021 | Kang et al. | |
| 2021/0327804 A1* | 10/2021 | Kim | H01L 23/528 |
| 2021/0343342 A1 | 11/2021 | Lee et al. | |
| 2022/0052069 A1 | 2/2022 | Kim et al. | |
| 2022/0093639 A1 | 3/2022 | Song et al. | |

* cited by examiner

SEMICONDUCTOR DEVICE AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2022-0091321, filed on Jul. 22, 2022, in the Korean Intellectual Property Office, the disclosure of which is incorporated by reference herein in its entirety.

BACKGROUND

The inventive concepts relate to a semiconductor device and an electronic system including the same, and more particularly, to a semiconductor device including a non-volatile vertical memory device and an electronic system including the non-volatile vertical memory device.

In an electronic system that needs to store data, a semiconductor device capable of storing high-capacity data has been advantageous. Thus, research is being conducted into methods of increasing the data storage capacity of a semiconductor device. For example, as one of the methods of increasing the data storage capacity of the semiconductor device, a semiconductor device including a vertical memory device including memory cells arranged three-dimensionally instead of memory cells arranged two-dimensionally has been proposed.

SUMMARY

The inventive concepts provide a semiconductor device, which may improve desired electrical properties and/or reliability even when the integration density of a semiconductor device including memory cells arranged three-dimensionally is increased.

The inventive concepts also provide an electronic system including a semiconductor device, which may improve desired electrical properties and/or reliability even when the integration density of a semiconductor device including memory cells arranged three-dimensionally is increased.

According to an aspect of the inventive concepts, there is provided a semiconductor device including a peripheral circuit structure including a plurality of circuits, a plurality of wiring layers, and a plurality of via contacts on the plurality of wiring layers, the plurality of via contacts being apart from each other in a lateral direction, a plate common source line covering the peripheral circuit structure, an insulating plug passing through the plate common source line in a vertical direction, a lateral insulating spacer between the peripheral circuit structure and the plate common source line, a memory stack structure including a plurality of gate lines on the plate common source line, the plurality of gate lines overlapping each other in the vertical direction, a through contact passing through at least one of the plurality of gate lines and the insulating plug in the vertical direction, the through contact being connected to a first via contact selected from the plurality of via contacts, and a source line contact passing through the lateral insulating spacer in the vertical direction, the source line contact being between a second via contact selected from the plurality of via contacts and the plate common source line, wherein a width of the first via contact is greater than a width of the insulating plug in the lateral direction.

According to another aspect of the inventive concepts, there is provided a semiconductor device including a peripheral circuit structure including a plurality of wiring layers, a first via contact, and a second via contact, the first via contact being connected to a first wiring layer selected from the plurality of wiring layers on the first wiring layer, the second via contact being connected to a second wiring layer selected from the plurality of wiring layers on the second wiring layer, wherein the second via contact is apart from the first via contact in a lateral direction, a lateral insulating spacer covering the peripheral circuit structure, the lateral insulating spacer including a first through opening and a second through opening, the first through opening overlapping the first via contact in a vertical direction, the second through opening overlapping the second via contact in the vertical direction, a source line contact passing through the lateral insulating spacer via the second through opening and contacting the second via contact, a plate common source line covering the peripheral circuit structure with the lateral insulating spacer therebetween, the plate common source line having a bottom surface in contact with each of a top surface of the lateral insulating spacer and a top surface of the source line contact and including a third through opening overlapping the first via contact in the vertical direction, an insulating plug filling the third through opening, a memory stack structure including a plurality of gate lines overlapping each other in the vertical direction on the plate common source line, and a through contact apart from the source line contact in the lateral direction, the through contact being integrally connected to the first via contact by passing through at least one of the plurality of gate lines and the insulating plug in the vertical direction and passing through the lateral insulating spacer via the first through opening in the vertical direction, wherein a width of the first via contact is greater than a width of the insulating plug in the lateral direction.

According to another aspect of the inventive concepts, there is provided an electronic system including a main substrate, a semiconductor device on the main substrate, and a controller electrically connected to the semiconductor device on the main substrate, wherein the semiconductor device includes a peripheral circuit structure including a plurality of circuits, a plurality of wiring layers, and a plurality of via contacts on the plurality of wiring layers, the plurality of via contacts being apart from each other in a lateral direction, a plate common source line covering the peripheral circuit structure, an insulating plug passing through the plate common source line in a vertical direction, a lateral insulating spacer between the peripheral circuit structure and the plate common source line, a memory stack structure including a plurality of gate lines overlapping each other in the vertical direction on the plate common source line, a through contact passing through at least one of the plurality of gate lines and the insulating plug in the vertical direction, the through contact being connected to a first via contact selected from the plurality of via contacts, a source line contact passing through the lateral insulating spacer in the vertical direction, the source line contact being between a second via contact selected from the plurality of via contacts and the plate common source line, and an input/output (I/O) electrically connectable to the peripheral circuit structure, wherein a width of the first via contact is greater than a width of the insulating plug in the lateral direction.

BRIEF DESCRIPTION OF THE DRAWINGS

Embodiments of the inventive concepts will be more clearly understood from the following detailed description taken in conjunction with the accompanying drawings in which:

FIGS. 4 to 8 are detailed diagrams of a semiconductor device according to example embodiments, wherein FIG. 4 is a plan view of some components of memory cell blocks, FIG. is a cross-sectional view taken along line X1-X1' of FIG. 4, FIG. 6 is a cross-sectional view taken along line Y1-Y1' of FIG. 4, FIG. 7 is an enlarged cross-sectional view of some components included in region "EX1" of FIG. 5, and FIG. 8 is an enlarged cross-sectional view of some components included in region "EX2" of FIG. 6;

FIGS. 16 to 33 are cross-sectional views of a method of manufacturing a semiconductor device, according to example embodiments, wherein FIGS. 16 to 19, 20A, 21A, 22A, 23A, 24A, 25, 26, 27A, 28, 29, 30A, 31, 32, and 33 are cross-sectional views of some components of a portion corresponding to the cross-section taken along line X1-X1' of FIG. 4, according to a process sequence.

DETAILED DESCRIPTION OF EXAMPLE EMBODIMENTS

Figure 1:
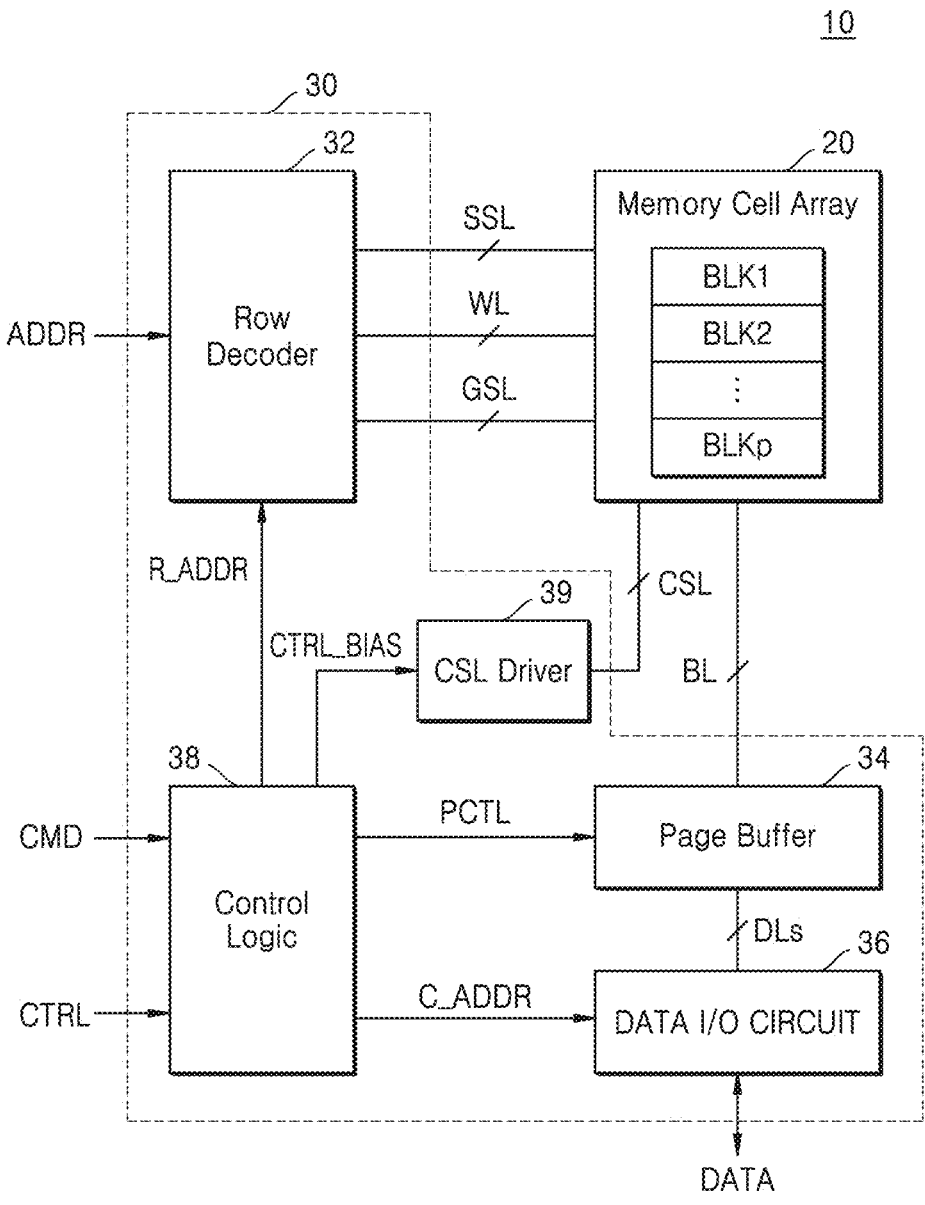
FIG. 1 is a block diagram of a semiconductor device according to example embodiments.

Hereinafter, example embodiments will be described in detail with reference to the accompanying drawings. The same reference numerals are used to denote the same elements in the drawings, and repeated descriptions thereof are omitted.

FIG. 1 is a block diagram of a semiconductor device 10 according to example embodiments.

Referring to FIG. 1, the semiconductor device 10 may include a memory cell array 20 and/or a peripheral circuit 30. The memory cell array 20 may include a plurality of memory cell blocks BLK1, BLK2, . . . , and BLKp. Each of the plurality of memory cell blocks BLK1, BLK2, . . . , and BLKp may include a plurality of memory cells. The memory cell blocks BLK1, BLK2, . . . , and BLKp may be connected to the peripheral circuit 30 through a bit line BL, a word line WL, a string selection line SSL, and a ground selection line GSL.

The peripheral circuit 30 may include a row decoder 32, a page buffer 34, a data input/output (I/O) circuit 36, a control logic 38, and/or a common source line driver (or CSL driver) 39. The peripheral circuit 30 may further include various circuits, such as a voltage generating circuit configured to generate various voltages required for operations of the semiconductor device 10, an error correction circuit configured to correct errors in data read from the memory cell array 20, an I/O interface, and the like.

The memory cell array 20 may be connected to the row decoder 32 through the word line WL, the string selection line SSL, and the ground selection line GSL and be connected to the page buffer 34 through the bit line BL. In the memory cell array 20, each of the plurality of memory cells in each of the plurality of memory cell blocks BLK1, BLK2, . . . , and BLKp may include a flash memory cell. The memory cell array 20 may include a three-dimensional (3D) memory cell array. The 3D memory cell array may include a plurality of NAND strings, and each of the plurality of NAND strings may include a plurality of memory cells respectively connected to a plurality of word lines WL, which are stacked vertically.

The peripheral circuit 30 may receive an address ADDR, a command CMD, and a control signal CTRL from the outside of the semiconductor device 10 and transmit and receive data DATA to and from a device that is outside the semiconductor device 10.

The row decoder 32 may select at least one of the plurality of memory cell blocks BLK1, BLK2, . . . , and BLKp in response to the address ADDR transmitted from the outside, and select the word line WL, the string selection line SSL, and the ground selection line GSL of the selected memory cell block. The row decoder 32 may transmit a voltage for performing a memory operation to the word line WL of the selected memory cell block.

The page buffer 34 may be connected to the memory cell array 20 through the bit line BL. In a program operation, the page buffer 34 may operate as a write driver and apply a voltage corresponding to the data DATA to be stored in the memory cell array 20, to the bit line BL. In a read operation, the page buffer 34 may operate as a sense amplifier and sense the data DATA stored in the memory cell array 20. The page buffer 34 may operate in response to a control signal PCTL provided from the control logic 38.

The data I/O circuit 36 may be connected to the page buffer 34 through a plurality of data lines DLs. In the program operation, the data I/O circuit 36 may receive the data DATA from a memory controller (not shown) and provide program data DATA to the page buffer 34 based on a column address C_ADDR provided from the control logic 38. In the read operation, the data I/O circuit 36 may provide the read data DATA stored in the page buffer 34 to the memory controller, based on the column address C_ADDR provided from the control logic 38.

The data I/O circuit 36 may transmit an input address or instruction to the control logic 38 or the row decoder 32. The peripheral circuit 30 may further include an electrostatic discharge (ESD) circuit and a pull-up/pull-down driver.

The control logic 38 may receive a command CMD and a control signal CTRL from the memory controller. The control logic 38 may provide a row address R_ADDR to the row decoder 32 and provide the column address C_ADDR to the data I/O circuit 36. The control logic 38 may generate various internal control signals used in the semiconductor device 10, in response to the control signal CTRL. For example, the control logic 38 may control a voltage level provided to the word line WL or the bit line BL during a memory operation, such as the program operation or an erase operation.

The CSL driver 39 may be connected to the memory cell array 20 through a common source line CSL. The CSL driver 39 may apply a common source voltage (e.g., a power supply voltage) or a ground voltage to the common source line CSL, based on a control signal CTRL_BIAS of the control logic 38.

Figure 2:
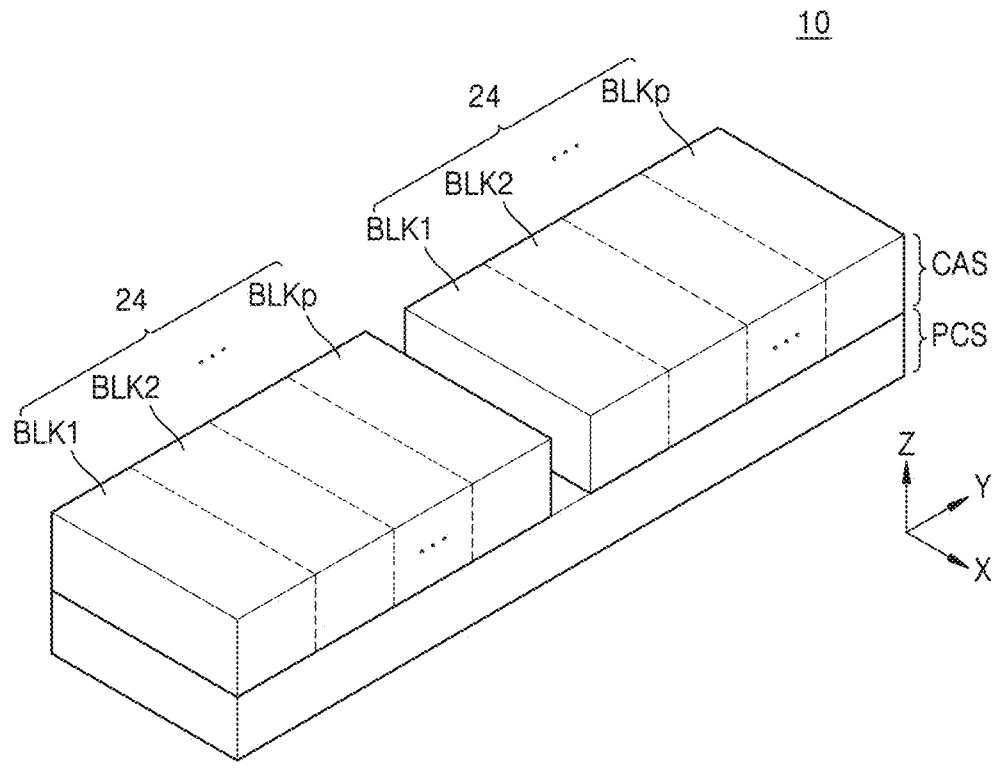
FIG. 2 is a perspective view of a semiconductor device according to example embodiments.

FIG. 2 is a perspective view of a semiconductor device 10 according to example embodiments.

Referring to FIG. 2, the semiconductor device 10 may include a cell array structure CAS and a peripheral circuit structure PCS, which overlap each other in a vertical direction (Z direction). The cell array structure CAS may include the memory cell array 20 described with reference to FIG. 1. The peripheral circuit structure PCS may include the peripheral circuit 30 described with reference to FIG. 1.

The cell array structure CAS may include a plurality of tiles 24. Each of the plurality of tiles 24 may include a plurality of memory cell blocks BLK1, BLK2, . . . , and BLKp. Each of the plurality of memory cell blocks BLK1, BLK2, . . . , and BLKp may include memory cells that are arranged three-dimensionally.

In example embodiments, two tiles 24 may constitute one mat, without being limited thereto. The memory cell array 20 described with reference to FIG. 1 may include a plurality of mats (e.g., four mats), without being limited thereto.

Figure 3:
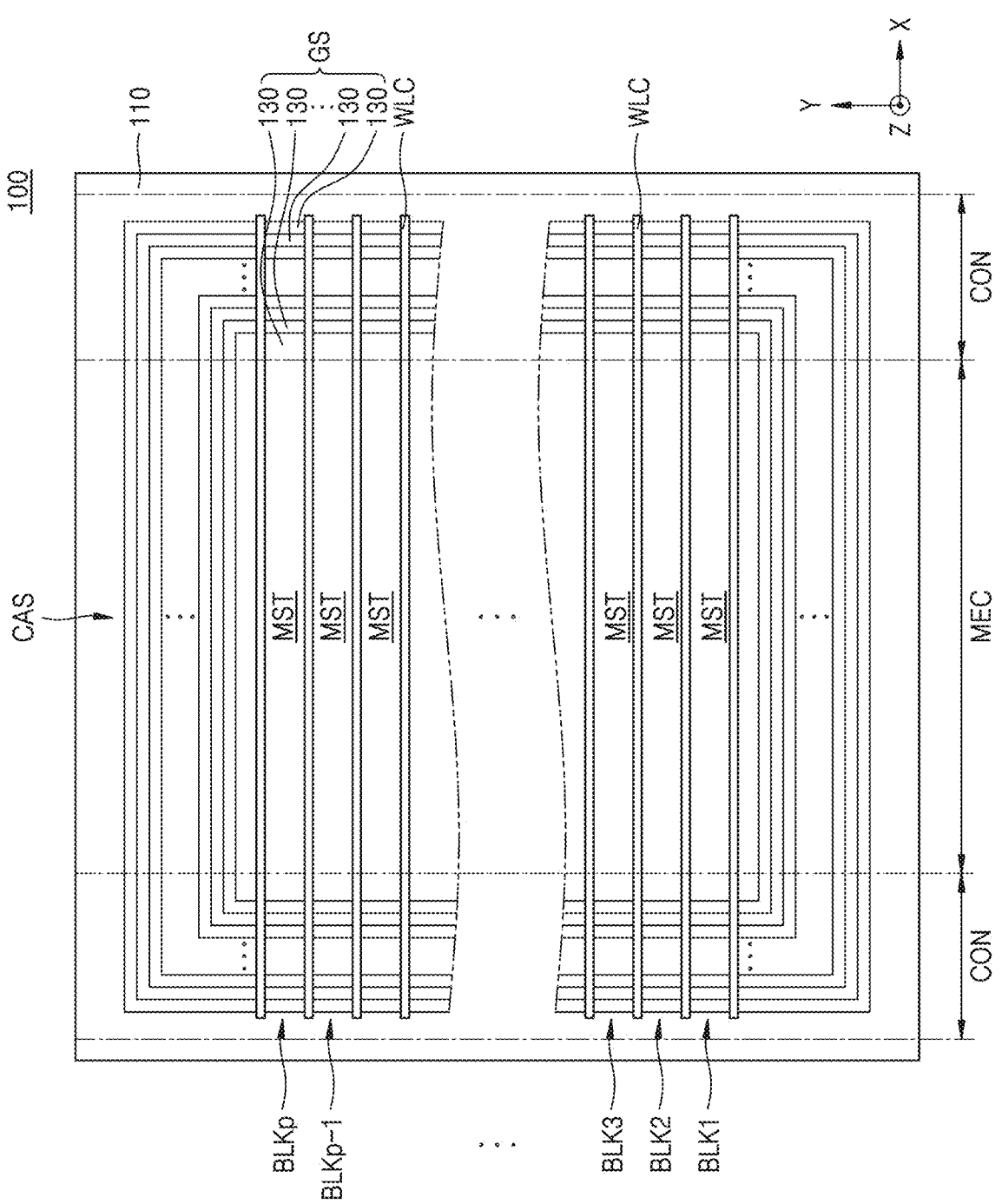
FIG. 3 is a plan view of a partial region of a semiconductor device according to example embodiments.

FIG. 3 is a plan view of a partial region of a semiconductor device 100 according to example embodiments.

Referring to FIG. 3, a cell array structure CAS of the semiconductor device 100 may include a plate common source line 110 and a plurality of memory cell blocks BLK1, BLK2, . . . , BLKp-1, and BLKp on the plate common source line 110.

The peripheral circuit structure (refer to PCS in FIG. 2) may be under the plate common source line 110. The plurality of memory cell blocks BLK1, BLK2, . . . , BLKp-1, and BLKp may overlap the peripheral circuit structure PCS with the plate common source line 110 therebetween in a vertical direction (Z direction). The peripheral circuit structure PCS under the plate common source line 110 may include the peripheral circuit 30 described with reference to FIG. 1.

The cell array structure CAS may include a memory cell area MEC and connection areas CON on both sides of the memory cell area MEC in a first lateral direction (X direction). Each of the plurality of memory cell blocks BLK1, BLK2, . . . , BLKp-1, and BLKp may include a memory stack structure MST, which extends in the first lateral direction (X direction) over the memory cell area MEC and the connection areas CON. The memory stack structure MST may include a plurality of gate lines 130, which are stacked in the memory cell area MEC and the connection areas CON on the plate common source line 110 to overlap each other in the vertical direction (Z direction). In each of a plurality of memory stack structures MST, the plurality of gate lines 130 may constitute a gate stack GS. The plurality of gate lines 130 may gradually reduce in area on an X-Y plane in a direction away from the plate common source line 110. A central portion of each of the plurality of gate lines 130 overlapping each other in the vertical direction (Z direction) may constitute the memory cell area MEC, while an edge portion of each of the plurality of gate lines 130 may constitute the connection area CON.

On the plate common source line 110, a plurality of word line cut structures WLC may extend long in the first lateral direction (X direction) in the memory cell area MEC and the connection areas CON. The plurality of word line cut structures WLC may be apart from each other in a second lateral direction (Y direction). The plurality of memory cell blocks BLK1, BLK2, . . . , BLKp-1, and BLKp may be respectively arranged one-by-one between the plurality of word line cut structures WLC.

Figure 4:
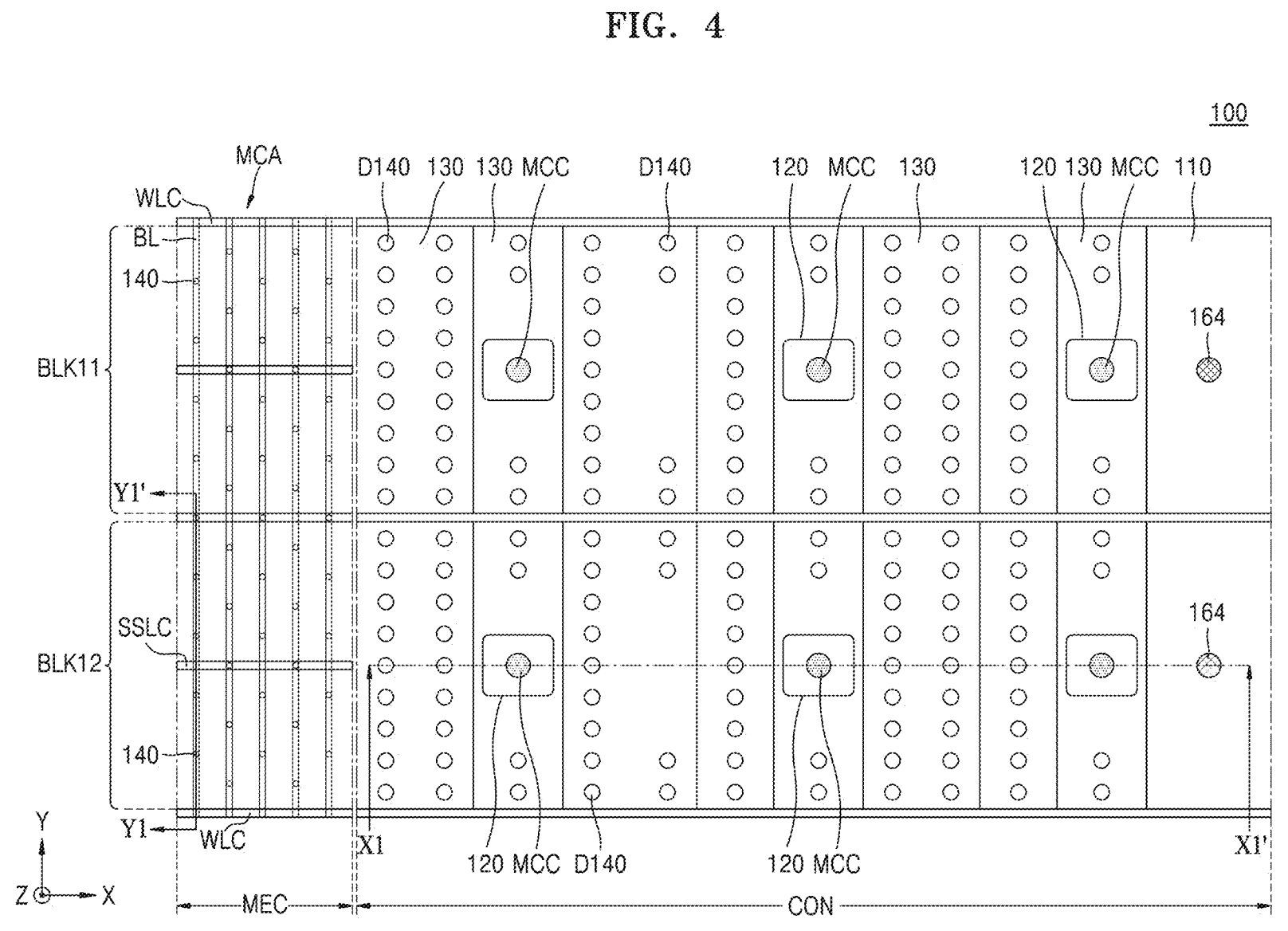
Figure 5:
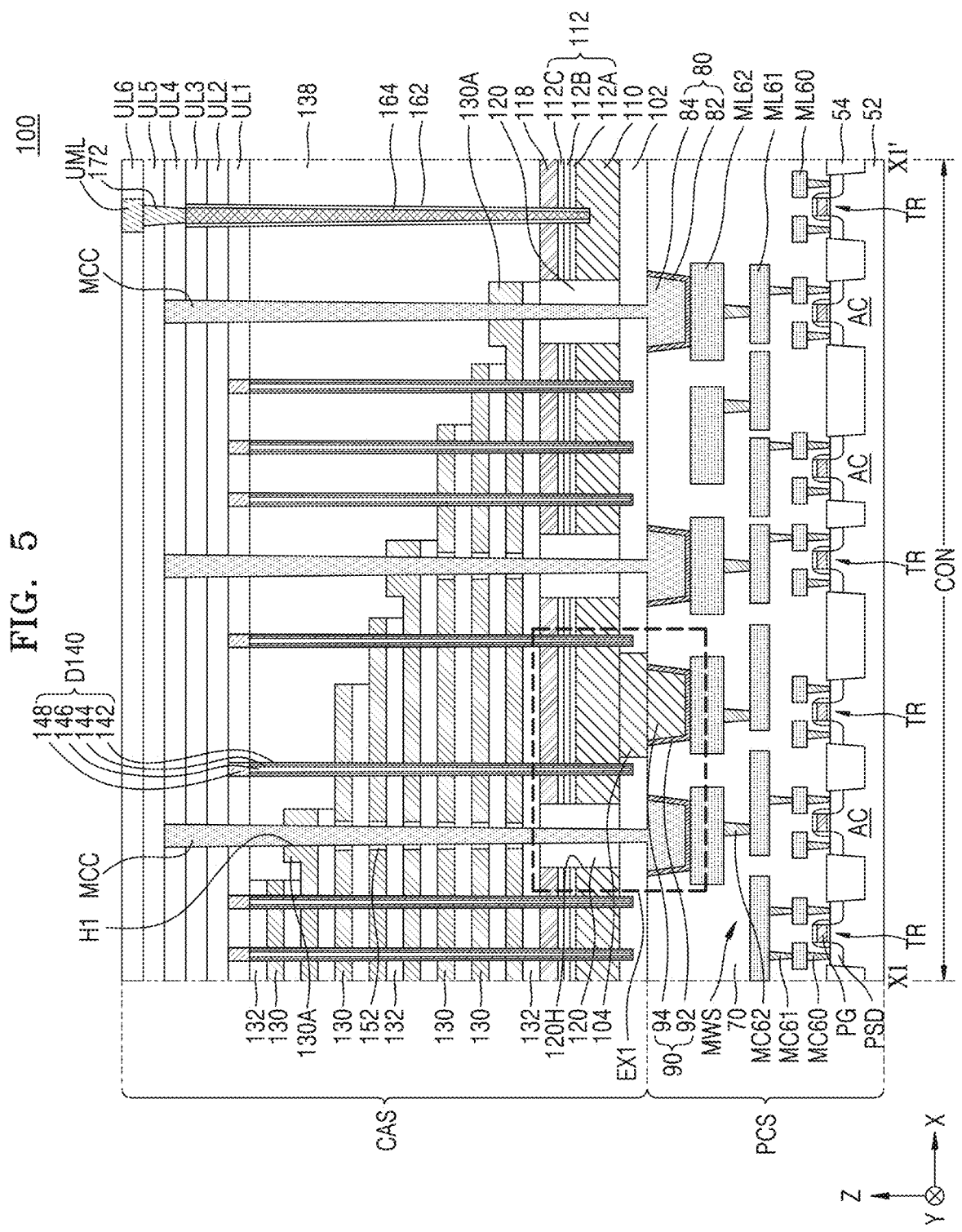
Figure 6:
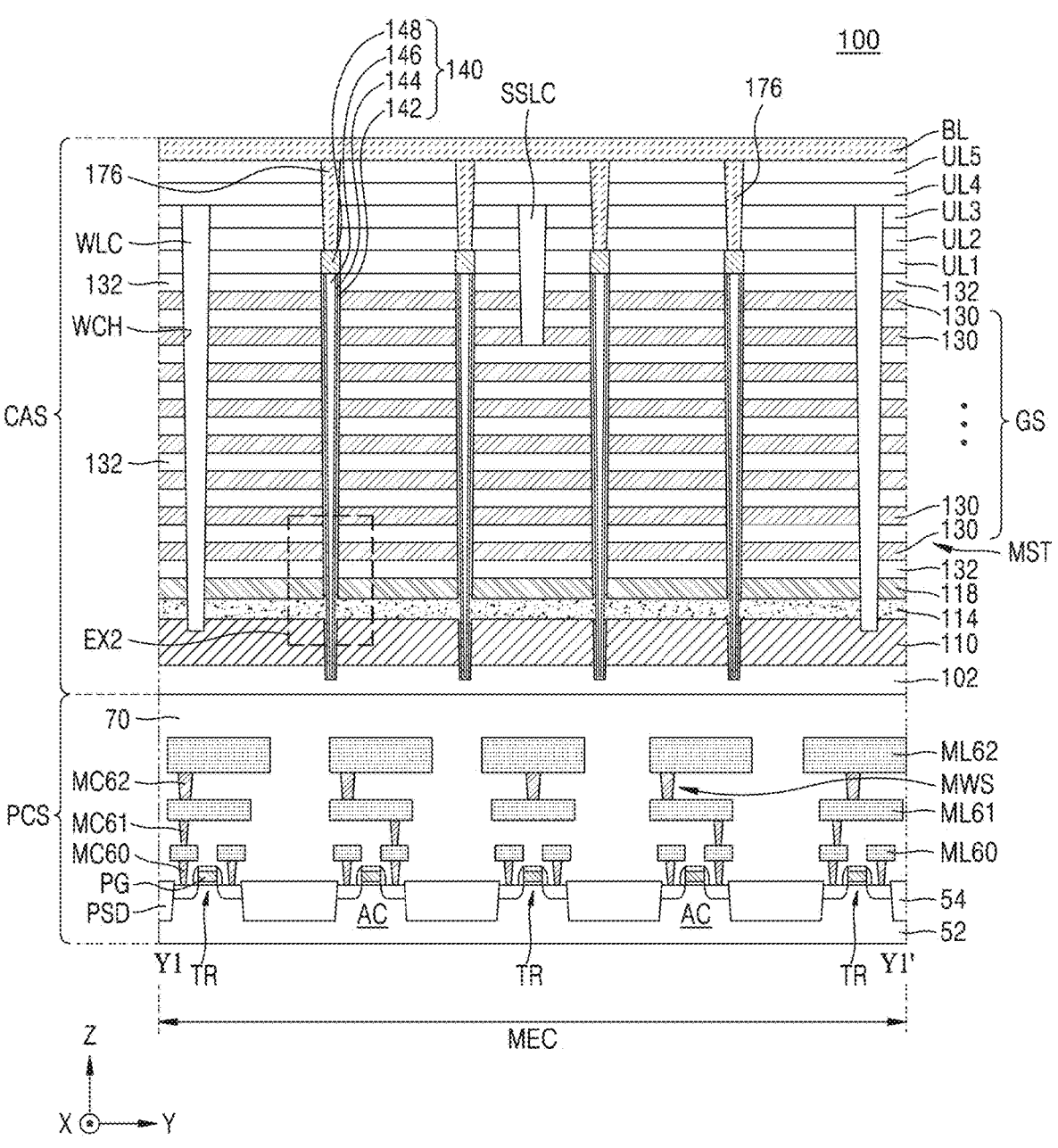
Figure 7:
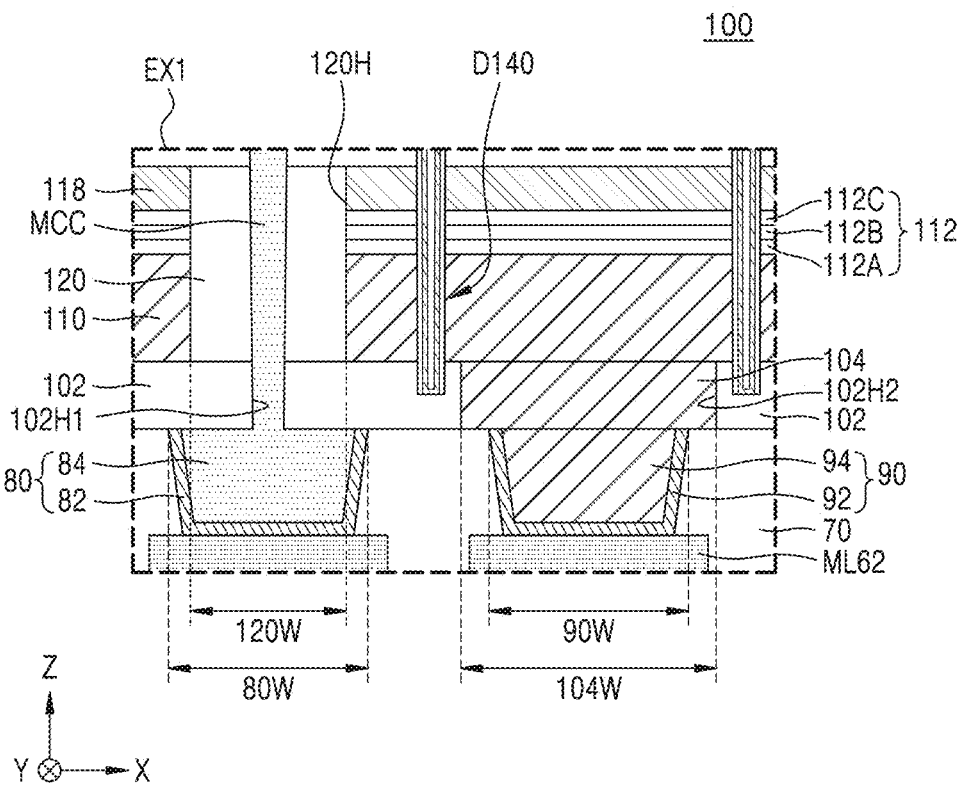
Figure 8:
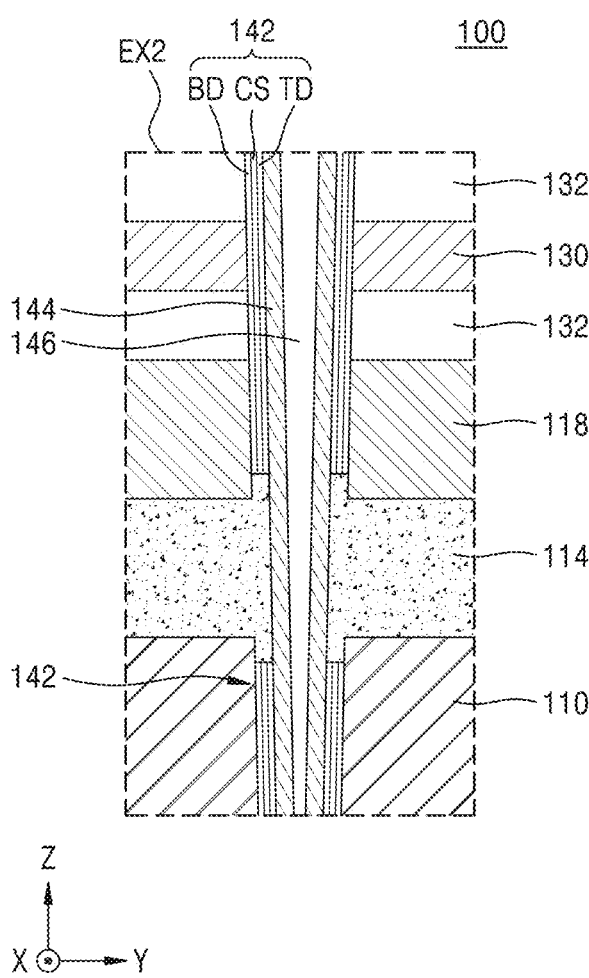

FIGS. 4 to 8 are detailed diagrams of a semiconductor device 100 according to example embodiments. For example, FIG. 4 is a plan view of some components of memory cell blocks BLK11 and BLK12. FIG. 5 is a cross-sectional view taken along line X1-X1' of FIG. 4. FIG. 6 is a cross-sectional view taken along line Y1-Y1' of FIG. 4. FIG. 7 is an enlarged cross-sectional view of some components included in region "EX1" of FIG. 5. FIG. 8 is an enlarged cross-sectional view of some components included in region "EX2" of FIG. 6. The memory cell blocks BLK11 and BLK12 shown in FIG. 4 may constitute some of the plurality of memory cell blocks BLK1, BLK2, . . . , BLKp-1, and BLKp shown in FIG. 3.

Referring to FIGS. 4 to 8, the semiconductor device 100 may include a peripheral circuit structure PCS and a cell array structure CAS on the peripheral circuit structure PCS. The cell array structure CAS may overlap the peripheral circuit structure PCS in a vertical direction (Z direction).

The cell array structure CAS may include a plate common source line 110, a first conductive plate 114, a second conductive plate 118, an insulating plate 112, and/or a memory stack structure MST. As shown in FIG. 5, in the connection area CON of the cell array structure CAS, respective edge portions of the insulating plate 112, the second conductive plate 118, and the plurality of gate lines 130 may be sequentially stacked on the plate common source line 110. As shown in FIG. 6, in the memory cell area MEC of the cell array structure CAS, the first conductive plate 114, the second conductive plate 118, and the memory stack structure MST may be sequentially stacked on the plate common source line 110.

The plate common source line 110, the first conductive plate 114, and the second conductive plate 118 may serve as a common source line CSL configured to supply current to vertical memory cells included in the cell array structure CAS.

In example embodiments, the plate common source line 110 may include a semiconductor material, such as polysilicon. Each of the first conductive plate 114 and the second conductive plate 118 may include a doped polysilicon film, a metal film, or a combination thereof. The metal film may include tungsten (W), without being limited thereto. The memory stack structure MST may include a gate stack GS. The gate stack GS may include a plurality of gate lines 130, which extend parallel to each other in a lateral direction and overlap each other in a vertical direction (Z direction). Each of the plurality of gate lines 130 may include a metal, a metal silicide, doped semiconductor, or a combination thereof. For example, each of the plurality of gate lines 130 may include a metal (e.g., tungsten, nickel, cobalt, and tantalum), a metal silicide (e.g., tungsten silicide, nickel silicide, cobalt silicide, and tantalum silicide), doped polysilicon, or a combination thereof.

An insulating film 132 may be between the second conductive plate 118 and one of the plurality of gate lines 130 and between the plurality of gate lines 130. An uppermost one of the plurality of gate lines 130 may be covered by the insulating film 132. The insulating film 132 may include silicon oxide.

As shown in FIGS. 4 and 6, in the memory cell area MEC and the connection area CON, a plurality of word line cut structures WLC may extend long in a first lateral direction (X direction) on the plate common source line 110. A width of each of the plurality of gate lines 130 included in the memory cell blocks BLK11 and BLK12 in a second lateral direction (Y direction) may be defined by the plurality of word line cut structures WLC.

Each of the plurality of word line cut structures WLC may include an insulating structure. In example embodiments, the insulating structure may include silicon oxide, silicon nitride, silicon oxynitride, or a low-k dielectric material. For example, the insulating structure may include a silicon oxide film, a silicon nitride film, a silicon oxynitride (SiON) film, a silicon oxycarbonitride (SiOCN) film, a silicon carbonitride (SiCN) film, or a combination thereof. In other example embodiments, at least a portion of the insulating structure may include an air gap. As used herein, the term "air" may refer to other gases that may be in the atmosphere or during a manufacturing process.

Between two adjacent word line cut structures WLC, a plurality of gate lines 130, which constitute one gate stack GS, may be stacked on the second conductive plate 118 to overlap each other in the vertical direction (Z direction). The plurality of gate lines 130, which constitute the one gate stack GS, may include the ground selection line GSL, the word line WL, and the string selection line SSL, which have been described with reference to FIG. 1.

As shown in FIG. 6, two upper ones of the plurality of gate lines 130 may be apart from each other in the second lateral direction (Y direction) with a string selection line cut structure SSLC therebetween. The two gate lines 130, which are apart from each other with the string selection line cut structure SSLC therebetween, may each constitute the string selection line SSL described with reference to FIG. 1. Although FIG. 6 illustrates example embodiments in which one string selection line cut structure SSLC is formed in one gate stack GS, the inventive concepts are not limited thereto. For example, at least two string selection line cut structures SSLC may be formed in one gate stack GS. The string selection line cut structure SSLC may be filled with an insulating film. In example embodiments, the string selection line cut structure SSLC may include an insulating film, which includes an oxide film, a nitride film, or a combination thereof. In example embodiments, at least a portion of the string selection line cut structure SSLC may include an air gap.

As shown in FIGS. 5 and 6, the peripheral circuit structure PCS may include a substrate 52, a plurality of peripheral circuits on the substrate 52, and a multilayered wiring structure MWS configured to connect the plurality of peripheral circuits to each other or a multilayered wiring structure MWS configured to connect the plurality of peripheral circuits to components in the memory cell area MEC.

The substrate 52 may include a semiconductor substrate. For example, the substrate 52 may include silicon (Si), germanium (Ge), or silicon germanium (SiGe). An active region AC may be defined by a device isolation film 54 in the substrate 52. A plurality of transistors TR, which constitute the plurality of peripheral circuits, may be formed on the active region AC. Each of the plurality of transistors TR may include a gate PG and a plurality of ion implantation regions PSD formed on both sides of the gate PG in the active region AC. Each of the plurality of ion implantation regions PSD may constitute a source region or a drain region of the transistor TR.

The plurality of peripheral circuits in the peripheral circuit structure PCS may include various circuits included in the peripheral circuit 30 described with reference to FIG. 1. In example embodiments, the plurality of peripheral circuits in the peripheral circuit structure PCS may include the row decoder 32, the page buffer 34, the data I/O circuit 36, the control logic 38, and the CSL driver 39, which are illustrated in FIG. 1.

The multilayered wiring structure MWS in the peripheral circuit structure PCS may include a plurality of wiring layers (e.g., ML60, ML61, and ML62) and a plurality of contacts (e.g., MC60, MC61, and MC62). At least some of the wiring layers ML60, ML61, and ML62 may be electrically connectable to the transistor TR. The contacts MC60, MC61, and MC62 may connect the plurality of transistors TR to some selected from the wiring layers ML60, ML61, and ML62.

As shown in FIG. 5, the peripheral circuit structure PCS may include a plurality of via contacts (e.g., 80 and 90), which are on the wiring layers ML60, ML61, and ML62 and apart from each other in a lateral direction (e.g., X direction in FIG. 5). The plurality of via contacts (e.g., 80 and 90) may include a first via contact 80 and a second via contact 90. The first via contact 80 may be on one wiring layer ML62, which is selected from the wiring layers ML60, ML61, and ML62, and connected to the wiring layer ML62. The second via contact 90 may be on another wiring layer ML62, which is selected from the wiring layers ML60, ML61, and ML62, and connected to the other wiring layer ML62. The first via contact 80 and the second via contact 90 may be at the same vertical level on the substrate 52. The first via contact 80 and the second via contact 90 may be apart from each other in a lateral direction (e.g., the X direction of FIG. 5).

The first via contact 80 may be connected to at least one of a plurality of circuits in the peripheral circuit structure PCS through the wiring layer ML62. The second via contact 90 may be grounded through the wiring layer ML62. As used herein, from among the wiring layers ML60, ML61, and ML62, the wiring layer ML62 connected to the first via contact 80 may be referred to as a first wiring layer, and the wiring layer ML62 connected to the second via contact 90 may be referred to as a second wiring layer.

The plurality of transistors TR and the multilayered wiring structure MWS, which are in the peripheral circuit structure PCS, may be covered by an interlayer insulating film 70. The interlayer insulating film 70 may include a silicon oxide film, a silicon nitride film, a SiON film, a SiOCN film, or a combination thereof.

As shown in FIGS. 5, 6, and 7, the semiconductor device 100 may include a lateral insulating spacer 102 between the peripheral circuit structure PCS and the plate common source line 110. In example embodiments, the lateral insulating spacer 102 may include a silicon oxide film, a silicon nitride film, a SiON film, a SiOCN film, a SiCN film, or a combination thereof.

The lateral insulating spacer 102 may cover the peripheral circuit structure PCS under each of the memory cell area MEC and the connection area CON. As shown in FIG. 7, the lateral insulating spacer 102 may include a first through opening 102H1 and a second through opening 102H2. The first through opening 102H1 may overlap the first via contact 80 in a vertical direction (Z direction). The second through opening 102H2 may overlap the second via contact 90 in the vertical direction (Z direction).

As shown in FIGS. 5 and 7, the semiconductor device 100 may include a source line contact 104, which passes through the lateral insulating spacer 102 in the vertical direction (Z direction) via the second through opening 102H2. The source line contact 104 may be between the second via contact 90 and the plate common source line 110. A bottom surface of the source line contact 104 may be in contact with a top surface of the second via contact 90, and a top surface of the source line contact 104 may be in contact with a bottom surface of the plate common source line 110.

Each of the lateral insulating spacer 102, the plate common source line 110, the insulating plate 112, the first conductive plate 114, and the second conductive plate 118 may extend in a lateral direction to cover the peripheral circuit structure PCS. The plate common source line 110 may cover the peripheral circuit structure PCS with the lateral insulating spacer 102 therebetween. The bottom surface of the plate common source line 110 may be in contact with each of a top surface of the lateral insulating spacer 102 and the top surface of the source line contact 104. The plate common source line 110 may be connected to the wiring layer ML62 through the source line contact 104 and the second via contact 90.

As shown in FIG. 5, in a partial region of the connection area CON, a plurality of third through openings 120H may be formed to pass through the plate common source line 110, the insulating plate 112, and the second conductive plate 118 in the vertical direction (Z direction). Each of the plurality of third through openings 120H may be filled with an insulating plug 120. A plurality of insulating plugs 120 respectively filling the plurality of third through openings 120H may each pass through the plate common source line 110, the insulating plate 112, and the second conductive plate 118 in the vertical direction (Z direction) and be at a position overlapping the first via contact 80 included in the peripheral circuit structure PCS in the vertical direction (Z direction). The insulating plug 120 may include a silicon oxide film, a silicon nitride film, or a combination thereof.

As shown in FIGS. 4 and 6, in the memory cell area MEC, a plurality of channel structures 140 may pass through the plurality of gate lines 130, the plurality of insulating films 132, the second conductive plate 118, the first conductive plate 114, and the plate common source line 110 in the vertical direction (Z direction). Each of the plurality of channel structures 140 may include a portion in contact with the lateral insulating spacer 102.

The plurality of channel structures 140 may be arranged a predetermined or alternatively, desired distance apart from each other in the first lateral direction (X direction) and the second lateral direction (Y direction). Each of the plurality of channel structures 140 may include a gate dielectric film 142, a channel region 144, a buried insulating film 146, and a drain region 148.

As shown in FIG. 8, the gate dielectric film 142 may include a tunneling dielectric film TD, a charge storage film CS, and a blocking dielectric film BD, which are sequentially formed in the channel region 144. Relative thicknesses of the tunneling dielectric film TD, the charge storage film CS, and the blocking dielectric film BD are not limited to those shown in FIG. 8 and may be variously modified.

The tunneling dielectric film TD may include silicon oxide, hafnium oxide, aluminum oxide, zirconium oxide, and/or tantalum oxide. The charge storage film CS may be a region in which electrons that have passed through the tunneling dielectric film TD from the channel region 144 may be stored. The charge storage film CS may include silicon nitride, boron nitride, silicon boron nitride, or doped polysilicon. The blocking dielectric film BD may include silicon oxide, silicon nitride, or an oxide having higher dielectric constant than silicon oxide. The metal oxide may include hafnium oxide, aluminum oxide, zirconium oxide, tantalum oxide, or a combination thereof.

As shown in FIG. 8, the first conductive plate 114 may pass through a partial region of the gate dielectric film 142 in a lateral direction (X direction and/or Y direction) and be in contact with the channel region 144. A thickness (Z-directional size) of a portion of the first conductive plate 114, which vertically overlaps the gate dielectric film 142, may be greater than a thickness (Z-directional size) of a portion of the first conductive plate 114, which vertically overlaps the second conductive plate 118. The gate dielectric film 142 may include a portion covering a sidewall of the channel region 144 at a higher level than the first conductive plate 114 and a portion covering a bottom surface of the channel region 144 at a lower level than the first conductive plate 114. The channel region 144 may be apart from the plate common source line 110 with the gate dielectric film 142 therebetween. The sidewall of the channel region 144 may be in contact with the first conductive plate 114 and electrically connectable to the first conductive plate 114.

As shown in FIGS. 6 and 8, the channel region 144 may have a cylindrical shape. The channel region 144 may include doped polysilicon or undoped polysilicon. The buried insulating film 146 may fill an inner space of the channel region 144. The buried insulating film 146 may include an insulating material. For example, the buried insulating film 146 may include silicon oxide, silicon nitride, silicon oxynitride, or a combination thereof. In some example embodiments, the buried insulating film 146 may be omitted. In some example embodiments, the channel region 144 may have a pillar structure having no inner vacant space.

The drain region 148 may include a doped polysilicon film. A plurality of drain regions 148 may be insulated from each other by a first upper insulating film UL1. In the memory cell area MEC, the plurality of channel structures 140 and the first upper insulating film UL1 may be covered by a second upper insulating film UL2.

The string selection line cut structure SSLC may pass through the first upper insulating film UL1, the second upper insulating film UL2, and the third upper insulating film UL3 in the vertical direction (Z direction). A top surface of the string selection line cut structure SSLC, a top surface of the word line cut structure WLC, and a top surface of the third upper insulating film UL3 may extend at the same or substantially the same vertical level. A fourth upper insulating film UL4 and a fifth upper insulating film UL5 may be sequentially formed on the string selection line cut structure SSLC, the word line cut structure WLC, and the third upper insulating film UL3. Each of the first upper insulating film UL1, the second upper insulating film UL2, the third upper insulating film UL3, the fourth upper insulating film UL4, and the fifth upper insulating film UL5 may include an oxide film, a nitride film, or a combination thereof.

As shown in FIGS. 4 and 6, in the memory cell area MEC of the memory stack structure MST, a plurality of bit lines BL may be on the fifth upper insulating film UL5. The plurality of bit lines BL may extend parallel to each other in a second lateral direction (Y direction). The plurality of channel structures 140 may be respectively connected to the plurality of bit lines BL through a plurality of contact plugs 176, which pass through the second upper insulating film UL2, the third upper insulating film UL3, the fourth upper insulating film UL4, and the fifth upper insulating film UL5.

As shown in FIG. 5, in the connection area CON of the memory stack structure MST, an insulating plate 112 and a second conductive plate 118 may be sequentially stacked on the plate common source line 110. The insulating plate 112 may include an insulating film having a multilayered structure including a first insulating film 112A, a second insulating film 112B, and a third insulating film 112C, which are sequentially stacked on the plate common source line 110. In example embodiments, each of the first insulating film 112A and the third insulating film 112C may include a silicon oxide film, and the second insulating film 112B may include a silicon nitride film.

In the connection area CON, each of the plurality of gate lines 130 may include a gate pad portion 130A, which has a greater thickness than the remaining portion of the gate line 130 in the vertical direction (Z direction). The gate pad portion 130A of the gate line 130 may be in the edge portion of the gate line 130, which is farthest from the memory cell area MEC. Although only the gate pad portion 130A included in one end of each of some of the plurality of gate lines 130 is illustrated in FIG. 5, the gate line 130 of which the gate pad portion 130A is invisible in FIG. 5 may include the gate pad portion 130A in another portion that is invisible in FIG. 5.

In the connection area CON, an edge portion of each of the plurality of gate lines 130 and the plurality of insulating films 132 may be covered by an interlayer insulating film 138. The interlayer insulating film 138 may include a silicon oxide film, without being limited thereto.

As shown in FIG. 5, a plurality of memory cell contacts MCC may be in the connection area CON. Each of the plurality of memory cell contacts MCC may be inside a vertical hole Ill, which passes through at least some of the interlayer insulating film 138, the plurality of gate lines 130, and the plurality of insulating films 132. Each of the plurality of memory cell contacts MCC may pass through the at least one gate line 130, at least one insulating film 132, the insulating plug 120, and the lateral insulating spacer 102 in the vertical direction (Z direction) and be integrally connected to the first via contact 80. Each of the plurality of memory cell contacts MCC may pass through the insulating plug 120 in the vertical direction (Z direction) via the third through opening 120H and pass through the lateral insulating spacer 102 in the vertical direction (Z direction) via the first through opening 102H1. Each of the plurality of memory cell contacts MCC may be apart from the source line contact 104 in a lateral direction (e.g., X direction of FIGS. 5 and 7). As used herein, each of the plurality of memory cell contacts MCC may be referred to as a through contact.

Each of the plurality of memory cell contacts MCC may be connected to a selected one of the plurality of gate lines 130 and may not be connected to other gate lines 130 except the selected gate line 130. Each of the plurality of memory cell contacts MCC may be in contact with the gate pad portion 130A of a selected one of the plurality of gate lines 130 and connected to the gate line 130, which is selected, through the gate pad portion 130A. Inside the vertical hole H1, the memory cell contact MCC may be apart from the other gate lines 130 except the selected gate line 130 in a lateral direction. An insulating ring 152 may be between the memory cell contact MCC and the gate line 130, which is not connected to the memory cell contact MCC. In example embodiments, the insulating ring 152 may include a silicon oxide film, without being limited thereto.

The memory cell contact MCC may extend to a top surface of the first via contact 80 through the vertical hole H1, the third through opening 120H, and the first through opening 102H1 and be connected to the wiring layer ML62, which is a selected one of the wiring layers ML60, ML61, and ML62, through the first via contact 80.

As shown in FIGS. 4 and 5, a plurality of dummy channel structures D140 may be in the connection area CON. Each of the plurality of dummy channel structures D140 may pass through at least some of the interlayer insulating film 138, the plurality of gate lines 130, and the plurality of insulating films 132. Each of the plurality of dummy channel structures D140 may pass through at least one of the plurality of gate lines 130. Each of the plurality of dummy channel structures D140 may pass through the at least one gate line 130, the at least one insulating film 132, the second conductive plate 118, the insulating plate 112, and the plate common source line 110 in the vertical direction (Z direction). Each of the plurality of dummy channel structures D140 may include a portion in contact with the lateral insulating spacer 102.

Similarly to the channel structure 140, each of the plurality of dummy channel structures D140 may include a gate dielectric film 142, a channel region 144, a buried insulating film 146, and a drain region 148. However, a planar size of each of the plurality of dummy channel structures D140 may be greater than a planar size of the channel structure 140. The number and arrangement shape of dummy channel structures D140 shown in FIG. 4 are just examples, but the inventive concepts are not limited thereto. In the connection area CON, the plurality of dummy channel structures D140 may be variously arranged at various positions selected in the memory stack structure MST.

As shown in FIG. 5, in the connection area CON, the interlayer insulating film 138 may be covered by the first upper insulating film UL1. The drain regions 148, which are respectively in the plurality of dummy channel structures D140, may be insulated from each other by the first upper insulating film UL. In the connection area CON, the plurality of dummy channel structures D140 and the first upper insulating film UL1 may be covered by a second upper insulating film UL2.

As shown in FIGS. 4 and 5, a conductive plate contact 164 may be in the connection area CON. The conductive plate contact 164 may pass through the third upper insulating film UL3, the second upper insulating film UL2, the first upper insulating film UL1, the interlayer insulating film 138, the second conductive plate 118, and the insulating plate 112 and extend to the plate common source line 110 in the vertical direction (Z direction). A sidewall of the conductive plate contact 164 may be covered by an insulating spacer 162. The fourth upper insulating film UL4 may cover a top surface of each of the conductive plate contact 164 and the insulating spacer 162.

The plurality of memory cell contacts MCC may pass through the first upper insulating film UL1, the second upper insulating film UL2, the third upper insulating film UL3, and the fourth upper insulating film UL4. A top surface of each of the plurality of memory cell contacts MCC may be covered by a fifth upper insulating film UL5 and a sixth upper insulating film UL6.

The conductive plate contact 164 may be connected to one of a plurality of upper wiring layers UML through a contact plug 172 that passes through the fourth upper insulating film UL4 and the fifth upper insulating film UL5. The plurality of upper wiring layers UML may be at the same vertical level as the plurality of bit lines BL in the memory cell area MEC. Respective spaces between the plurality of upper wiring layers UML and the plurality of bit lines BL may be filled with the sixth upper insulating film UL6. The sixth upper insulating film UL6 may include an oxide film, a nitride film, or a combination thereof.

Each of the plurality of memory cell contacts MCC, the conductive plate contact 164, the plurality of contact plugs 172, and the plurality of upper wiring layers UML may include tungsten, titanium, tantalum, copper, aluminum, titanium nitride, tantalum nitride, tungsten nitride, or a combination thereof.

In the connection area CON, the lateral insulating spacer 102, the plate common source line 110, the insulating plate 112, the first conductive plate 114, and the second conductive plate 118 may extend in a lateral direction to cover the peripheral circuit structure PCS.

Each of the plurality of memory cell contacts MCC may be connected to at least one selected from the plurality of peripheral circuits through the first via contact 80 and the multilayered wiring structure MWS included in the peripheral circuit structure PCS. FIGS. 5 and 6 pertain to an example in which the multilayered wiring structure MWS has a triple wiring layer in the vertical direction (Z direction), but the inventive concepts are not limited thereto. For example, the multilayered wiring structure MWS may include two wiring layers or four or more wiring layers.

Each of the wiring layers ML60, ML61, and ML62 and the contacts MC60, MC61, and MC62 may include a metal, a conductive metal nitride, a metal silicide, or a combination thereof. For example, each of the wiring layers ML60, ML61, and ML62 and the contacts MC60, MC61, and MC62 may include a conductive material, such as tungsten, molybdenum, titanium, cobalt, tantalum, nickel, tungsten silicide, titanium silicide, cobalt silicide, tantalum silicide, or nickel silicide.

Although FIG. 4 illustrates an example in which the plurality of memory cell contacts MCC are arranged in a line in the first lateral direction (X direction), the inventive concepts are not limited thereto. A planarly arranged structure of each of the plurality of memory cell contacts MCC may be variously selected within the scope of the inventive concepts.

In the peripheral circuit structure PCS, the first via contact 80 and the second via contact 90 may include different materials from each other. As shown in FIGS. 5 and 7, the first via contact 80 may include a first conductive barrier film 82 and a first contact plug 84 having a bottom surface and a sidewall, which are surrounded by the first conductive barrier film 82. The second via contact 90 may include a second conductive barrier film 92 and a second contact plug 94 having a bottom surface and a sidewall, which are surrounded by the second conductive barrier film 92.

The first conductive barrier film 82 and the second conductive barrier film 92 may include the same material as each other. In example embodiments, each of the first conductive barrier film 82 and the second conductive barrier film 92 may include titanium, tantalum, titanium nitride, tantalum nitride, or a combination thereof.

The first contact plug 84 and the second contact plug 94 may include different materials from each other. In example embodiments, the first contact plug 84 of the first via contact 80 may include a metal or a metal-containing material. For example, the first contact plug 84 may include tungsten, titanium, tantalum, copper, aluminum, titanium nitride, tantalum nitride, tungsten nitride, or a combination thereof. In example embodiments, the first contact plug 84 may include the same material as the memory cell contact MCC. In example embodiments, the second contact plug 94 of the second via contact 90 may include doped polysilicon, a metal silicide, or a combination thereof. The metal silicide may include tungsten silicide, without being limited thereto.

A top surface of the second contact plug 94 in the second via contact 90 may be in contact with a bottom surface of the source line contact 104, and a top surface of the source line contact 104 may be in contact with a bottom surface of the plate common source line 110. In example embodiments, the second contact plug 94, the source line contact 104, and the plate common source line 110 may include the same material as each other. In example embodiments, the top surface of the second contact plug 94 and the bottom surface of the source line contact 104, which are in contact with each other, may include the same material as each other. In example embodiments, the top surface of the source line contact 104 and the bottom surface of the plate common source line 110, which are in contact with each other, may include the same material as each other.

In example embodiments, each of the second contact plug 94, the source line contact 104, and the plate common source line 110 may not include a metal. For example, each of the second contact plug 94, the source line contact 104, and the plate common source line 110 may include doped polysilicon.

As shown in FIG. 7, a width 80W of the first via contact 80 may be greater than a width 120W of the insulating plug 120 in a lateral direction (e.g., the X direction of FIG. 7). In the first via contact 80 and the insulating plug 120, which overlap each other in the vertical direction (Z direction), the first via contact 80 may have portions, which protrude on both sides of the insulating plug 120 in a lateral direction (e.g., X direction of FIG. 7). Accordingly, the first via contact 80 may include a portion, which overlaps the plate common source line 110 with the lateral insulating spacer 102 therebetween in the vertical direction (Z direction). As described above, by adopting a structure in which the width 80W of the first via contact 80 in the lateral direction is relatively large, when the vertical hole H1, which is on or above the first via contact 80, is formed to form the memory cell contact MCC in the process of manufacturing the semiconductor device 100, the vertical hole Ill may be stably formed on or above the first via contact 80. Accordingly, a sufficient process margin may be provided when the semiconductor device 100 is manufactured.

As shown in FIG. 7, a width 104W of the source line contact 104 may be greater than a width 90W of the second via contact 90 in a lateral direction (e.g., the X direction of FIG. 7). In the source line contact 104 and the second via contact 90 that overlap each other in the vertical direction (Z direction), the source line contact 104 may have portions, which protrude on both sides of the second via contact 90 in a lateral direction (e.g., X direction of FIG. 7).

As shown in FIGS. 5 and 7, the first via contact 80 may be apart from the plate common source line 110 with the lateral insulating spacer 102 therebetween. The first via contact 80 may be apart from the source line contact 104 with the lateral insulating spacer 102 therebetween. The lateral insulating spacer 102 may have such a thickness as to provide a sufficient insulating margin between the first via contact 80 and the plate common source line 110, which are respectively under and on the lateral insulating spacer 102. In example embodiments, the lateral insulating spacer 102 may have a thickness of about 500 Å to about 1000 Å (e.g., about 700 Å to about 800 Å) in the vertical direction (Z direction), without being limited thereto. Because the lateral insulating spacer 102 is between the first via contact 80 and the plate common source line 110, even when the width 80W of the first via contact 80 in a lateral direction is sufficiently large as needed, there may for a reduced possibility of a short circuit between the first via contact 80 and the plate common source line 110.

The semiconductor device 100 described with reference to FIGS. 4 to 8 pertains to an example in which the plurality of memory cell contacts MCC, a plurality of insulating plugs 120, a plurality of first via contacts 80, the second via contact 90, and the source line contact 104 are in the connection area CON, but the inventive concepts are not limited thereto. For example, each of the plurality of memory cell contacts MCC, the plurality of insulating plugs 120, the plurality of first via contacts 80, the second via contact 90, and the source line contact 104 may be in both the memory cell area MEC and the connection area CON.

In the semiconductor device 100 described with reference to FIGS. 4 to 8, even when a stacked number of gate lines 130 in the memory stack structure MST in the vertical direction (Z direction) is increased to improve the degree of integration of the semiconductor device 100, the occurrence of failures due to misalignment between the first via contact 80 and the plurality of memory cell contacts MCC that extend from the connection area CON of the cell array structure CAS through the at least one gate line 130 to the first via contact 80 included in the peripheral circuit structure PCS may be reduced or prevented, and a reliable electrical connection structure may be provided between the plurality of memory cell contacts MCC and the peripheral circuits in the peripheral circuit structure PCS. In addition, because the first via contact 80 is apart from the plate common source line 110 with the lateral insulating spacer 102 therebetween, a sufficient insulating margin may be obtained between the first via contact 80 and the plate common source line 110 by the lateral insulating spacer 102. Therefore, the electrical properties and reliability of the semiconductor device 100 may be improved.

Figure 9:
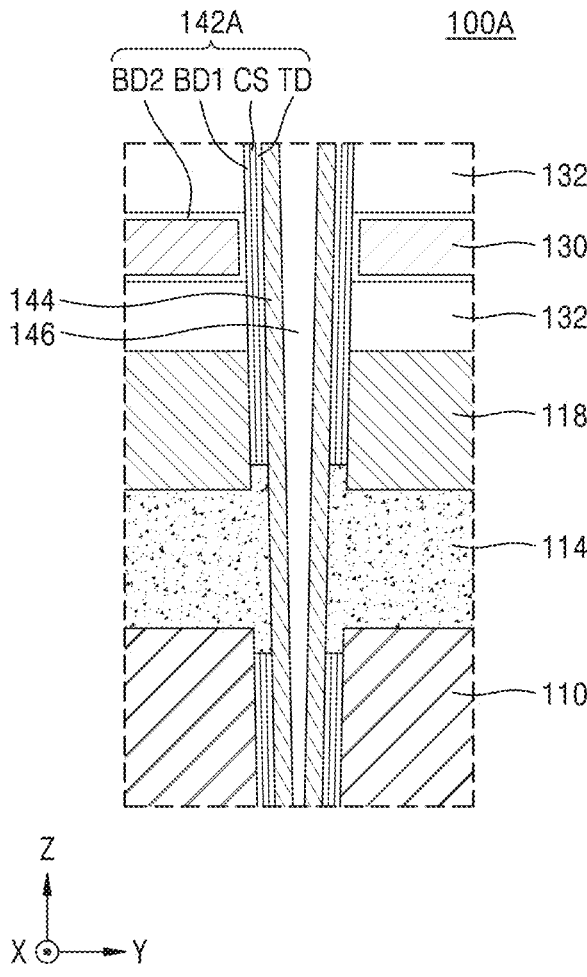
FIG. 9 is a cross-sectional view of a semiconductor device according to example embodiments.

FIG. 9 is a cross-sectional view of a semiconductor device 100A according to example embodiments. FIG. 9 illustrates an enlarged cross-sectional configuration of a portion corresponding to region "EX2" of FIG. 6.

Referring to FIG. 9, the semiconductor device 100A may substantially have the same configuration as the semiconductor device 100 described with reference to FIGS. 4 to 8. However, the semiconductor device 100A may include a gate dielectric film 142A instead of the gate dielectric film 142. The gate dielectric film 142A may substantially have the same configuration as the gate dielectric film 142 described with reference to FIG. 8. However, the gate dielectric film 142A may include a first blocking dielectric film BD1 and a second blocking dielectric film BD2 instead of the blocking dielectric film BD. The first blocking dielectric film BD1 may extend in parallel with the channel region 144, and the second blocking dielectric film BD2 may surround a gate line 130. Each of the first blocking dielectric film BD and the second blocking dielectric film BD2 may include silicon oxide, silicon nitride, or a metal oxide. For example, the first blocking dielectric film BD1 may include silicon oxide, and the second blocking dielectric film BD2 may include a metal oxide having a higher dielectric constant than a silicon oxide film. The metal oxide may include hafnium oxide, aluminum oxide, zirconium oxide, tantalum oxide, or a combination thereof.

Figure 10:
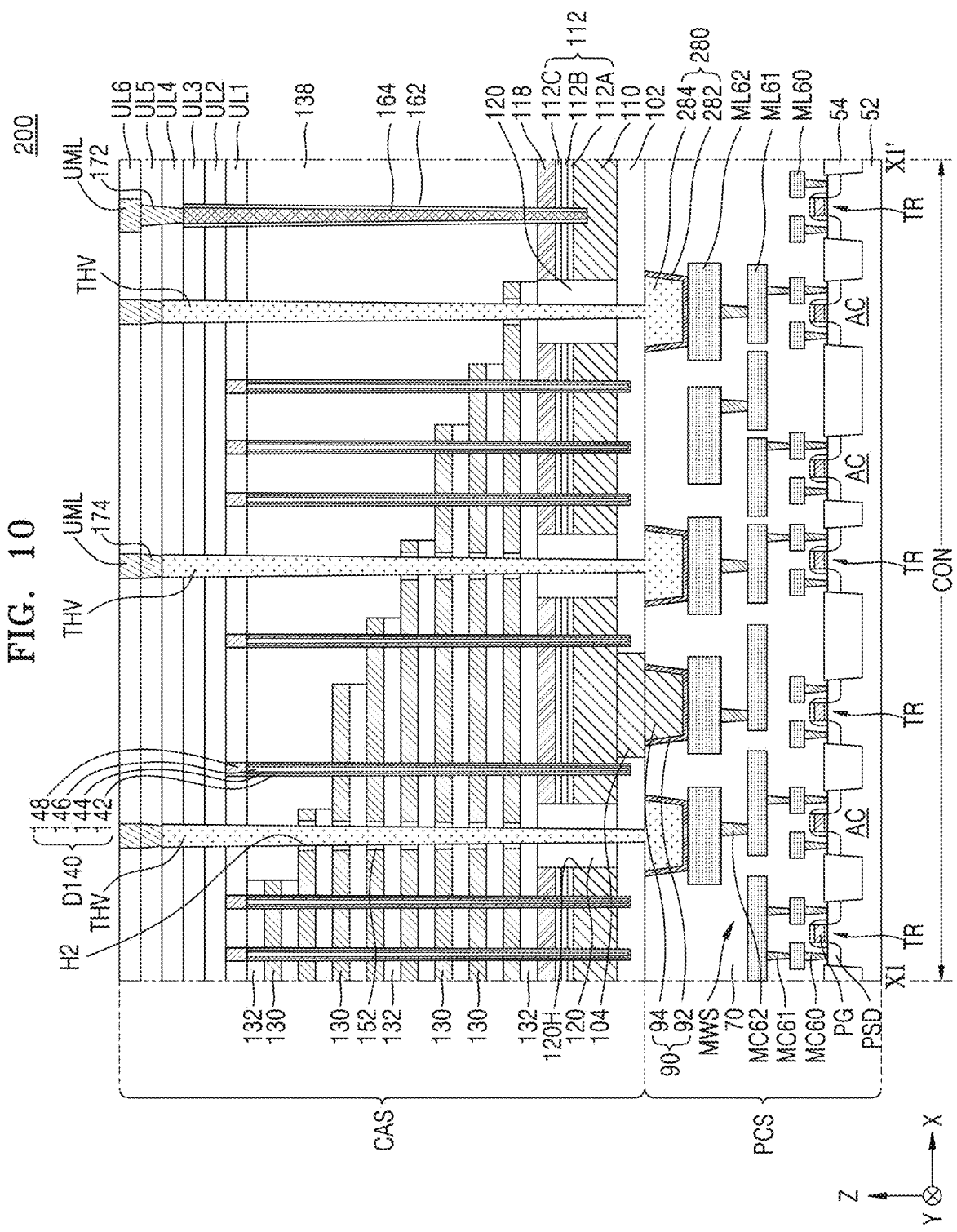
FIG. 10 is a cross-sectional view of a semiconductor device according to example embodiments.

FIG. 10 is a cross-sectional view of a semiconductor device 200, according to example embodiments. FIG. 10 illustrates a cross-sectional configuration of some components of a portion of the semiconductor device 200, which corresponds to a cross-section taken along line X1-X1' of FIG. 4. In FIG. 10, the same reference numerals are used to denote the same elements as in FIGS. 4 to 8, and thus, repeated descriptions thereof will be omitted.

Referring to FIG. 10, the semiconductor device 200 may substantially have the same configuration as the semiconductor device 100 described with reference to FIGS. 4 to 8. However, the semiconductor device 200 may include a plurality of through electrodes THV in a connection area CON.

Each of the plurality of through electrodes THV may be inside a vertical hole H2, which passes through at least one of the plurality of gate lines 130. Each of the plurality of through electrodes THV may be inside the vertical hole 112, which passes through at least some of the interlayer insulating film 138, the plurality of gate lines 130, and the plurality of insulating films 132. Each of the plurality of through electrodes THV may pass through at least one gate line 130, at least one insulating film 132, an insulating plug 120, and a lateral insulating spacer 102 in a vertical direction (Z direction) and be integrally connected to the first via contact 80. Similarly to the memory cell contact MCC described with reference to FIGS. 5 and 7, each of the plurality of through electrodes THV may pass through the insulating plug 120 and the lateral insulating spacer 102 in the vertical direction (Z direction). Each of the plurality of through electrodes THV may be apart from the source line contact 104 in a lateral direction (e.g., X direction of FIG. 10). As used herein, each of the plurality of through electrodes THV may be referred to as a through contact.

Each of the plurality of through electrodes THV may be apart from the plurality of gate lines 130 in a lateral direction such that each of the plurality of through electrodes THV is not connected to any one of the plurality of gate lines 130. An insulating ring 152 may be between the gate line 130 and the through electrode THV inside the vertical hole H2. Each of the plurality of through electrodes THV may extend to a top surface of the first via contact 80 and be integrally connected to the first via contact 80 and also be connected to one wiring layer ML62, which is selected from the plurality of wiring layers ML60, ML61, ML62, through the first via contact 80.

The plurality of through electrodes THV may pass through the second upper insulating film UL2, the third upper insulating film UL3, and the fourth upper insulating film UL4 in the vertical direction (Z direction). Each of the plurality of through electrodes THV may be connected to one of a plurality of upper wiring layers UML through one of a plurality of contact plugs 174, which passes through the fifth upper insulating film UL5. Each of the plurality of through electrodes THV may be connected to at least one peripheral circuit selected from a plurality of peripheral circuits through a multilayered wiring structure MWS included in a peripheral circuit structure PCS.

Each of the plurality of through electrodes THV may include the same material as a constituent material of the first contact plug 84 of the first via contact 80. Each of the plurality of through electrodes THV, the plurality of contact plugs 174, and the plurality of upper wiring layers UML may include tungsten, titanium, tantalum, copper, aluminum, titanium nitride, tantalum nitride, tungsten nitride, or a combination thereof.

The arrangement of through electrodes THV shown in FIG. 10 are just an example and may be variously modified and changed within the scope of the inventive concepts. Although a plurality of memory cell contacts MCC are not illustrated in FIG. 10, the semiconductor device 200 may further include the plurality of memory cell contacts MCC described with reference to FIGS. 4 to 7 and a plurality of first via contacts 80, which are integrally connected thereto.

As described with reference to FIGS. 5 and 7, a width 80W of the first via contact 80 may be greater than a width 120W of the insulating plug 120 in a lateral direction. As described above, by adopting a structure in which the width 80W of the first via contact 80 in the lateral direction relatively large, when the vertical hole H2, which is on or above the first via contact 80, is formed to form the THV in the process of manufacturing the semiconductor device 200, the vertical hole 112 may be stably formed on or above the first via contact 80. Accordingly, a sufficient process margin may be provided when the semiconductor device 200 is manufactured.

The semiconductor device 200 described with reference to FIG. 10 pertains to an example in which the plurality of through electrodes THV are in the connection area CON, but the inventive concepts are not limited thereto. For example, the plurality of through electrodes THV may be in both the memory cell area MEC and the connection area CON.

In the semiconductor device 200 described with reference to FIG. 10, even when a stacked number of gate lines 130 in the memory stack structure MST in the vertical direction (Z direction) is increased to improve the degree of integration of the semiconductor device 200, the occurrence of failures due to misalignment between the first via contact 80 and the plurality of through electrodes THV that extend from the connection area CON of a cell array structure CAS through the at least one gate line 130 to the first via contact 80 included in the peripheral circuit structure PCS may be reduced or prevented, and a reliable electrical connection structure may be provided between the plurality of through electrodes THV and the peripheral circuits in the peripheral circuit structure PCS.

Figure 11:
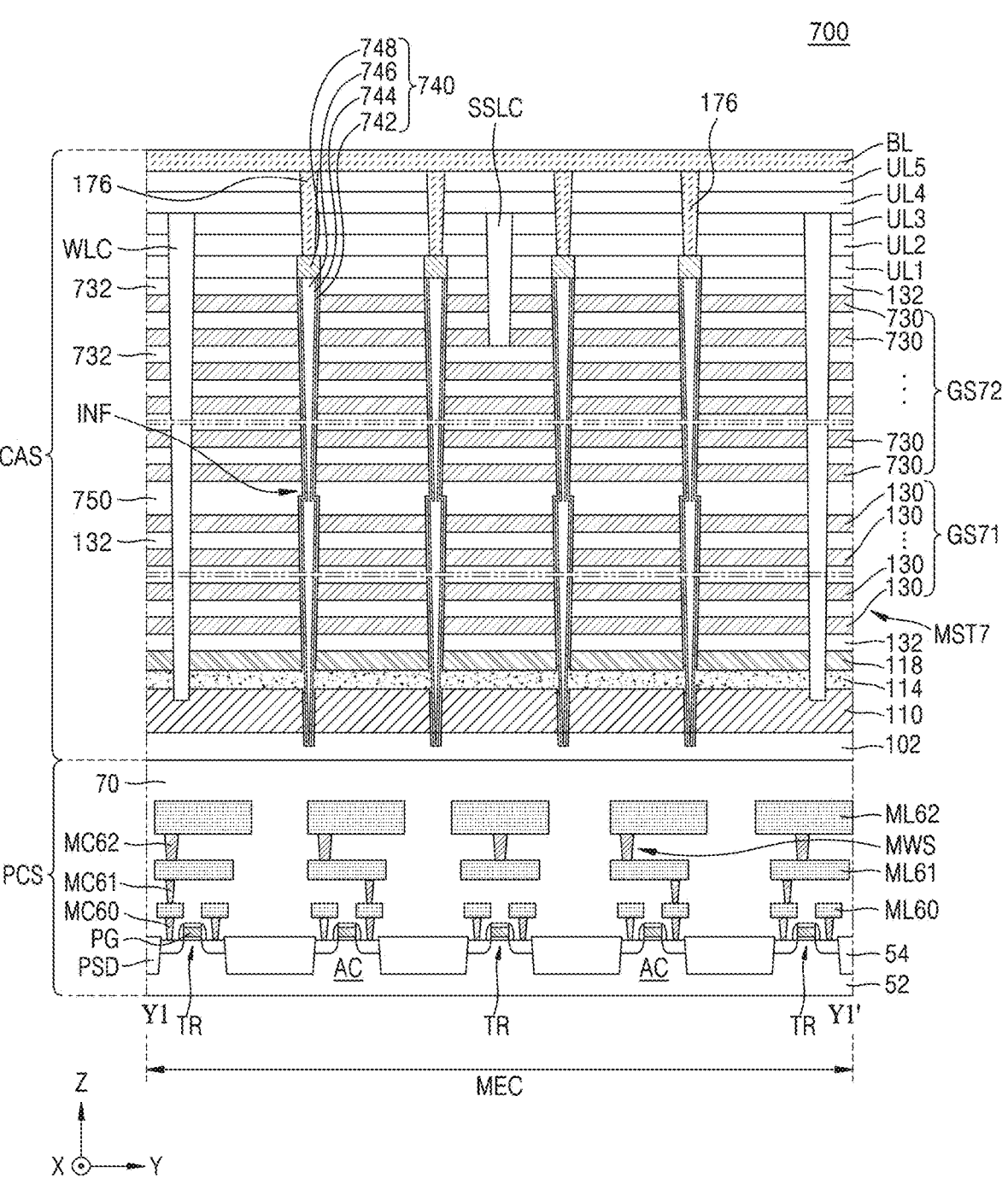
FIG. 11 is a cross-sectional view of a semiconductor device according to example embodiments.

FIG. 11 is a cross-sectional view of a semiconductor device 700 according to example embodiments. FIG. 11 illustrates a cross-sectional configuration of some components of a portion of the semiconductor device 700, which corresponds to a cross-section taken along line Y1-Y1' of FIG. 4. In FIG. 11, the same reference numerals are used to denote the same elements as in FIGS. 4 to 8, and thus, repeated descriptions thereof will be omitted.

Referring to FIG. 11, the semiconductor device 700 may substantially have the same configuration as the semiconductor device 100 described with reference to FIGS. 4 to 8. However, the semiconductor device 700 may include a memory stack structure MST7 instead of the memory stack structure MST of the semiconductor device 100.

The memory stack structure MST7 may include a lower gate stack GS71 including a plurality of gate lines 130 and an upper gate stack GS72 including a plurality of gate lines 730. An insulating film 132 may be between every two adjacent ones of the plurality of gate lines 130 in the lower gate stack GS71, and an insulating film 732 may be between every two adjacent ones of the plurality of gate lines 730 in the upper gate stack GS72. A middle insulating film 750 having a greater thickness than each of the insulating film 132 and the insulating film 732 may be between the lower gate stack GS71 and the upper gate stack GS72. Each of the insulating film 732 and the middle insulating film 750 may include a silicon oxide film.

In example embodiments, the lower gate stack GS71 may include a plurality of gate lines 130, which are stacked to overlap each other in a vertical direction (Z direction), and the upper gate stack GS72 may include a plurality of gate lines 730, which are stacked to overlap each other in the vertical direction (Z direction). In example embodiments, the sum of the number of gate lines 130 in the lower gate stack GS71 and the number of gate lines 730 in the upper gate stack GS72 may be at least 100, for example, at least 128. However, a stacked number of gate lines 130 and a stacked number of gate lines 730 are not limited to the example described above.

In a memory cell area MEC of a cell array structure CAS, a plurality of channel structures 740 may pass through the plurality of gate lines 730, the plurality of insulating films

732, the middle insulating film 750, a plurality of gate lines 130, a plurality of insulating films 132, the second conductive plate 118, the first conductive plate 114, and a plate common source line 110 and extend long in the vertical direction (Z direction). Each of the plurality of channel structures 740 may include a portion in contact with the lateral insulating spacer 102.

The plurality of channel structures 740 may include a gate dielectric film 742, a channel region 744, a buried insulating film 746, and a drain region 748. The gate dielectric film 742, the channel region 744, the buried insulating film 746, and the drain region 748 may respectively have the same or substantially the same configurations as the gate dielectric film 142, the channel region 144, the buried insulating film 146, and the drain region 148, which are included in the channel structure 140 and described with reference to FIGS. 6 and 8. However, each of the gate dielectric film 742, the channel region 744, and the buried insulating film 746, which are in the plurality of channel structures 740, may include an infection portion INF, which is surrounded by the middle insulating film 750. In example embodiments, to form the plurality of channel structures 740 in the process of manufacturing the semiconductor device 700, firstly, a lower channel hole may be formed to pass through a lower mold structure including the plurality of insulating films 132. Thereafter, while the lower channel hole is being filled with a sacrificial film, an upper channel hole may be formed to pass through an upper mold structure including the plurality of insulating films 732 and connected to the lower channel hole. In such a method, a channel hole having a two-stage structure required to form the plurality of channel structures 740 may be formed. Afterwards, the sacrificial film filling the lower channel hole may be removed, and the gate dielectric film 742, the channel region 744, and the buried insulating film 746 may be formed inside the channel hole having the two-stage structure. During the formation of the gate dielectric film 742, the channel region 744, and the buried insulating film 746 inside the channel hole having the two-stage structure, an inflection portion INF may be formed at each of the gate dielectric film 742, the channel region 744, and the buried insulating film 746 due to a difference in width between the lower channel hole and the upper channel hole in a lateral direction in the vicinity of a portion where the lower channel hole meets the upper channel hole. Although not shown, the semiconductor device 700 may include a connection area CON having a structure similar to that described with reference to FIGS. 5 and 7.

Figure 12:
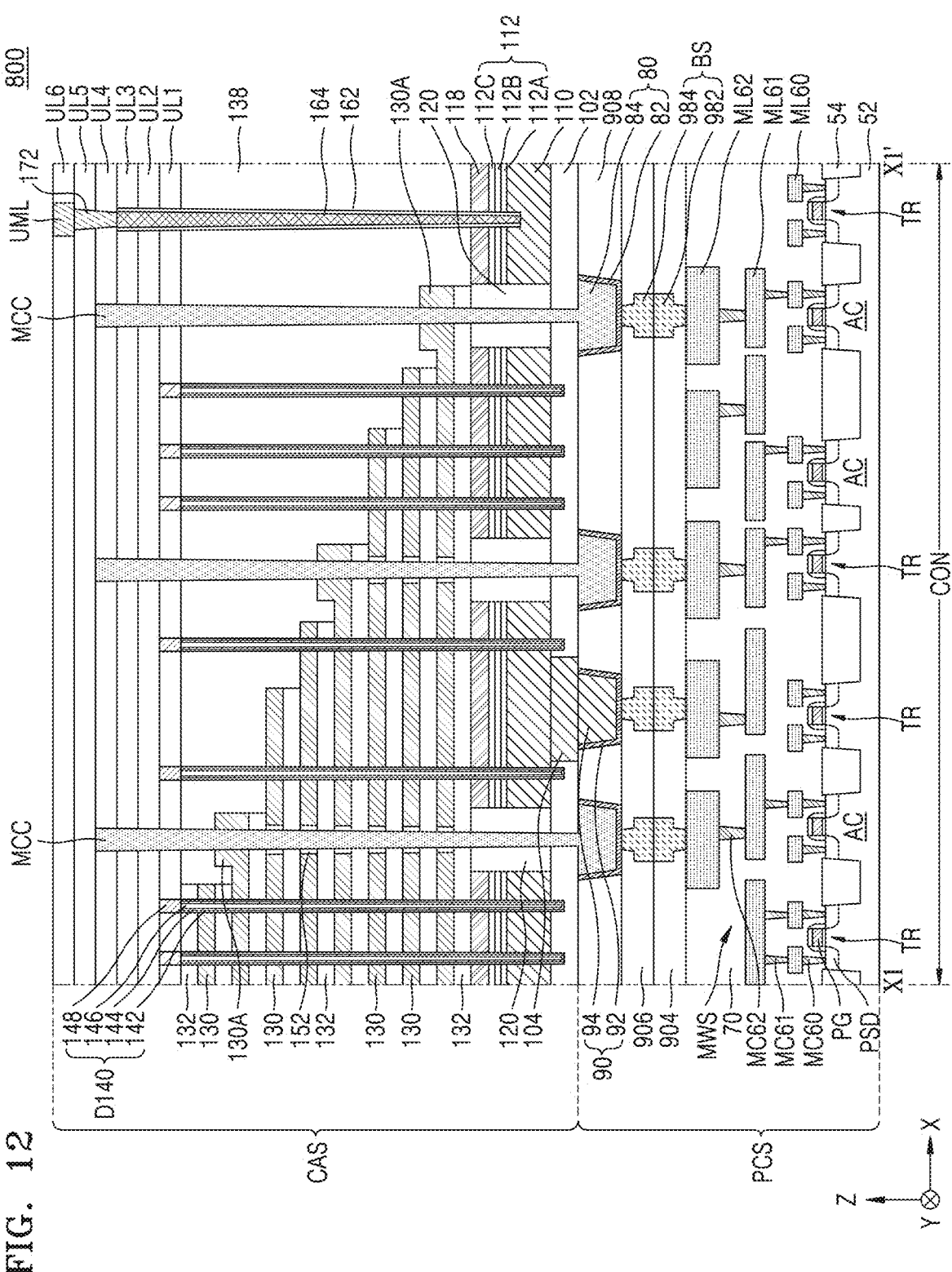
FIG. 12 is a cross-sectional view of a semiconductor device according to example embodiments.

FIG. 12 is a cross-sectional view of a semiconductor device 800 according to example embodiments. FIG. 12 illustrates a cross-sectional configuration of some components of a portion of the semiconductor device 800, which corresponds to a cross-section taken along line X1-X1' of FIG. 4. In FIG. 12, the same reference numerals are used to denote the same elements as in FIGS. 4 to 8, and thus, repeated descriptions thereof will be omitted.

Referring to FIG. 12, the semiconductor device 800 may substantially have the same configuration as the semiconductor device 100 described with reference to FIGS. 4 to 8. However, in the semiconductor device 800, a peripheral circuit structure PCS may include a multilayered wiring structure MWS and a plurality of bonding structures BS between a plurality of first via contacts 80 and a second via contact 90.

The plurality of bonding structures BS may have structures in which a plurality of first bonding metal pads 982 connected to wiring layers ML62, which are uppermost wiring layers of the multilayered wiring structure MWS, are bonded and electrically connectable to a plurality of second bonding metal pads 984, which are respectively connected to the plurality of first via contacts 80 and the second via contact 90. In example embodiments, each of the plurality of first bonding metal pads 982 and the plurality of second bonding metal pads 984 may include copper (Cu), aluminum (Al), or tungsten (W).

The plurality of first bonding metal pads 982 may be insulated from each other by a first insulating film 904. The plurality of second bonding metal pads 984 may be insulated from each other by a second insulating film 906. The plurality of first via contacts 80 and the second via contact 90 may be insulated from each other by a third insulating film 908. Each of the first insulating film 904, the second insulating film 906, and the third insulating film 908 may include a silicon oxide film, a silicon nitride film, or a combination thereof.

In example embodiments, to manufacture the semiconductor device 800, a plurality of transistors TR constituting a plurality of circuits, the multilayered wiring structure MWS, and an interlayer insulating film 70 may be formed on a substrate 52. Next, a top surface of the interlayer insulating film 70 and top surfaces of the plurality of wiring layers ML62, which are the uppermost wiring layers of the multilayered wiring structure MWS, may be planarized. Afterwards, the first insulating film 904 may be formed to cover the interlayer insulating film 70 and the plurality of wiring layers ML62. The plurality of first bonding metal pads 982 may be formed through the first insulating film 904 and connected to the plurality of wiring layers ML62. In addition, a third insulating film 908 may be formed on a support substrate (not shown), and the plurality of first via contacts 80 and the second via contact 90 passing through the third Insulating film 908 and a cell array structure CAS on the plurality of first via contacts 80 and the second via contact 90 may be formed in similar manners to those described with reference to FIGS. 17 to 33 Thereafter, the support substrate may be removed to expose the plurality of first via contacts 80 and the second via contact 90. Afterwards, the second insulating film 906 may be formed to cover the third insulating film 908, the plurality of first via contacts 80, and the second via contact 90. The plurality of second bonding metal pads 984 may be formed through the second insulating film 906 and connected to the plurality of first via contacts 80 and the second via contact 90. Subsequently, a structure including the first bonding metal pad 982 may be bonded to a structure including the plurality of second bonding metal pads 984 such that the plurality of first bonding metal pads 982 are electrically connectable to the plurality of second bonding metal pads 984.

In the semiconductor device 800, the plurality of memory cell contacts MCC may be connected to at least one of a plurality of circuits in the peripheral circuit structure PCS through the first via contact 80), the bonding structure BS and the multilayered wiring structure MWS. The plate common source line 110 may be grounded through the second via contact 90, the bonding structure BS, and the multilayered wiring structure MWS.

Figure 13:
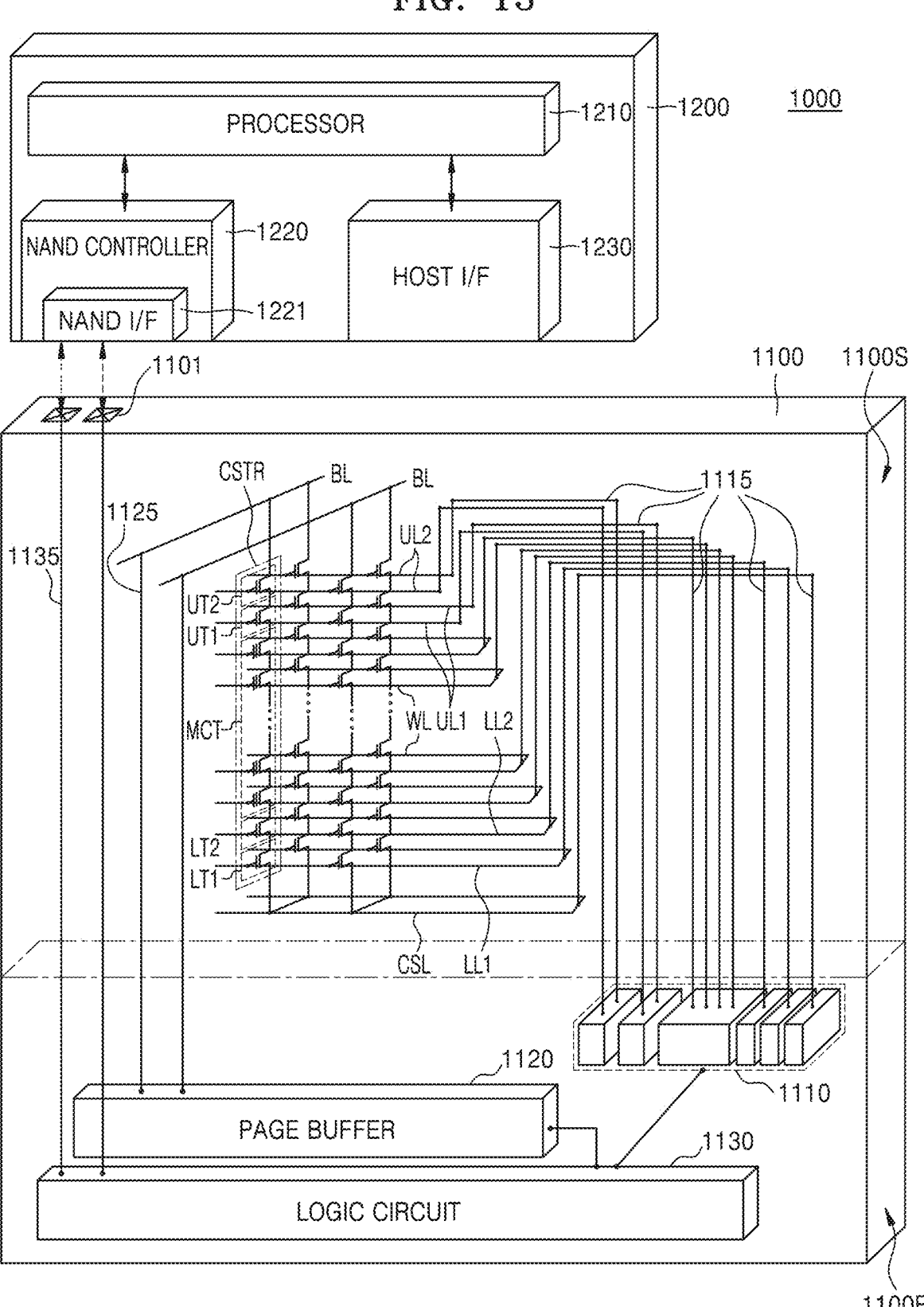
FIG. 13 is a schematic diagram of an electronic system including a semiconductor device, according to example embodiments.

FIG. 13 is a schematic diagram of an electronic system 1000 including a semiconductor device, according to example embodiments.

Referring to FIG. 13, the electronic system 1000 according to example embodiments may include a semiconductor device 1100 and a controller 1200 electrically connected to the semiconductor device 1100. The electronic system 1000 may be a storage device including at least one semiconductor device 1100 or an electronic device including the storage device. For example, the electronic system 1000 may include a solid-state drive (SSD) device, a universal serial bus (USB), a computing system, a medical device, or a communication device, which includes the at least one semiconductor device 1100.

The semiconductor device 1100 may include a nonvolatile memory device. For example, the semiconductor device 1100 may include a NAND flash memory device including at least one of the structures of the semiconductor devices 100, 100A, 200, 700, and 800, which have been described with reference to FIGS. 3 to 12. The semiconductor device 1100 may include a first structure 1100F and a second structure 1100S on the first structure 1100F. In example embodiments, the first structure 1100F may be beside the second structure 1100S. The first structure 1100F may include a peripheral circuit structure including a decoder circuit 1110, a page buffer 1120, and a logic circuit 1130. The second structure 1100S may be a memory cell structure including a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, each of the plurality of memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors (e.g., LT1 and LT2) and the number of upper transistors (e.g., UT1 and UT2) may be variously changed according to example embodiments.

In example embodiments, the upper transistors UT1 and UT2 may include a string selection transistor, and the lower transistors LT1 and LT2 may include a ground selection transistor. The first and second gate lower lines LL1 and LL2 may be respectively gate electrodes of the lower transistors LT1 and LT2. The word line WL may be a gate electrode of the memory cell transistor MCT, and the first and second gate upper lines UL1 and UL2 may be gate electrodes of the upper transistors UT1 and UT2.

The common source line CSL, the first and second gate lower lines LL1 and LL2, the plurality of word lines WL, and the first and second gate upper lines UL1 and UL2 may be electrically connected to the decoder circuit 1110 through a plurality of first connecting wires 1115, which extend to the second structure 1100S in the first structure 1100F. The plurality of bit lines BL may be electrically connected to the page buffer 1120 through a plurality of second connecting wirings 1125, which extend to the second structure 1100S in the first structure 1100F.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The semiconductor device 1100 may communicate with the controller 1200 through an I/O pad 1101 that is electrically connected to the logic circuit 1130. The I/O pad 1101 may be electrically connected to the logic circuit 1130 through I/O connection wirings 1135, which extend to the second structure 1100S in the first structure 1100F.

The controller 1200 may include a processor 1210, a NAND controller 1220, and a host interface (or host I/F) 1230. In some example embodiments, the electronic system 1000 may include a plurality of semiconductor devices 1100. In some example embodiments, the controller 1200 may control the plurality of semiconductor devices 1100.

The processor 1210 may control all operations of the electronic system 1000 including the controller 1200. The processor 1210 may operate according to predetermined or alternatively, desired firmware and may access the semiconductor device 1100 by controlling the NAND controller 1220. The NAND controller 1220 may include a NAND interface (or NAND I/F) 1221 configured to process communication with the semiconductor device 1100. A control command for controlling the semiconductor device 1100, data to be written to the plurality of memory cell transistors MCT of the semiconductor device 1100, and data to be read from the plurality of memory cell transistors MCT of the semiconductor device 1100 may be transmitted through the NAND interface 1221. The host interface 1230 may provide a communication function between the electronic system 1000 and an external host. When receiving the control command from the external host through the host interface 1230, the processor 1210 may control the semiconductor device 1100 in response to the control command.

Figure 14:
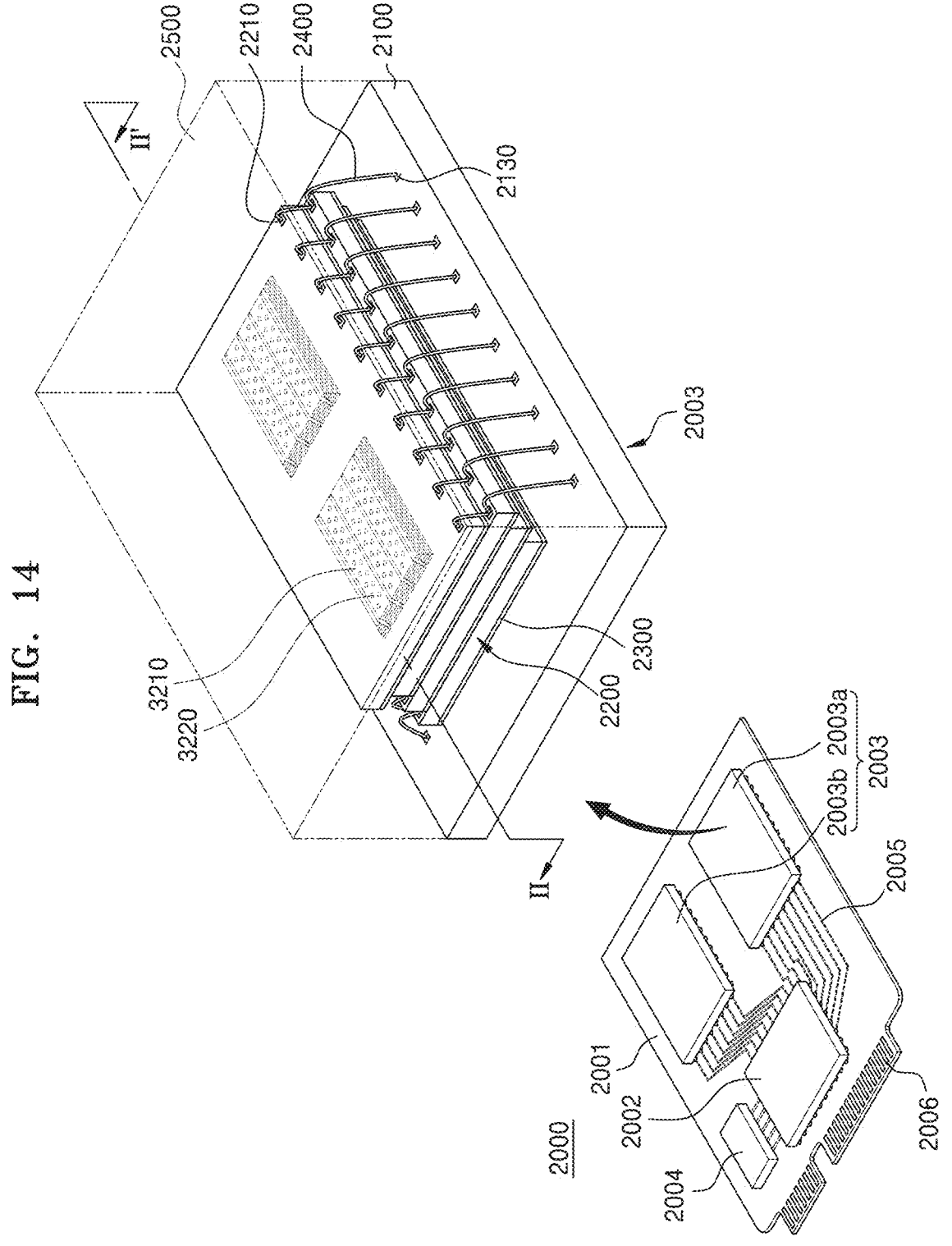
FIG. 14 is a perspective view of an electronic system including a semiconductor device, according to example embodiments.

FIG. 14 is a perspective view of an electronic system 2000 including a semiconductor device, according to example embodiments.

Referring to FIG. 14, the electronic system 2000 according to example embodiments may include a main substrate 2001, a controller 2002 mounted on the main substrate 2001, at least one semiconductor package 2003, and DRAM 2004. The semiconductor package 2003 and the DRAM 2004 may be connected to the controller 2002 by a plurality of wiring patterns 2005 formed in the main substrate 2001.

The main substrate 2001 may include a connector 2006 including a plurality of pins that are combined with an external host. In the connector 2006, the number and arrangement of pins may depend on a communication interface between the electronic system 2000 and the external host. In example embodiments, the electronic system 2000 may communicate with the external host by using any one of interfaces, such as a USB, peripheral component interconnect-express (PCI-E), serial advanced technology attachment (SATA), and M-Phy for universal flash storage (UFS). In example embodiments, the electronic system 2000 may operate by power received from the external host through the connector 2006. The electronic system 2000 may further include a power management integrated circuit (PMIC) configured to divide power supplied from the external host into the controller 2002 and the semiconductor package 2003.

The controller 2002 may write data to the semiconductor package 2003 or read data from the semiconductor package 2003 and improve an operating speed of the electronic system 2000.

The DRAM 2004 may be a buffer memory configured to reduce a speed difference between the semiconductor package 2003, which is a data storage space, and the external host. The DRAM 2004 included in the electronic system 2000 may operate as a kind of cache memory and provide a space for temporarily storing data in a control operation on the semiconductor package 2003. When the electronic system 2000 includes the DRAM 2004, the controller 2002 may further include a DRAM controller configured to control the DRAM 2004 in addition to a NAND controller configured to control the semiconductor package 2003.

The semiconductor package 2003 may include first and second semiconductor packages 2003a and 2003b, which are apart from each other. Each of the first and second semiconductor packages 2003a and 2003b may include a semiconductor package including a plurality of semiconductor chips 2200. Each of the first and second semiconductor packages 2003a and 2003b may include a package substrate 2100, the plurality of semiconductor chips 2200 on the substrate 2100, an adhesive layer 2300 on a bottom surface of each of the plurality of semiconductor chips 2200, a connection structure 2400 configured to electrically connect the plurality of semiconductor chips 2200 to the package substrate 2100, and a molding layer 2500 covering the plurality of semiconductor chips 2200 and the connection structure 2400 on the package substrate 2100.

The package substrate 2100 may include a printed circuit board (PCB) including the plurality of package upper pads 2130. Each of the plurality of semiconductor chips 2200 may include an I/O pad 2210. The I/O pad 2210 may correspond to the I/O pad 1101 of FIG. 19. Each of the plurality of semiconductor chips 2200 may include a plurality of gate stacks 3210 and a plurality of channel structures 3220. Each of the plurality of semiconductor chips 2200 may include at least one of the structures of the semiconductor devices 100, 100A, 200, 700, and 800 that have been described with reference to FIGS. 3 to 12.

In example embodiments, the connection structure 2400 may include a bonding wire configured to electrically connect the I/O pad 2210 to the package upper pad 2130. Accordingly, in the first and second semiconductor packages 2003a and 2003b, the plurality of semiconductor chips 2200 may be electrically connected to each other using a bonding wire technique and electrically connected to the package upper pad 2130 of the package substrate 2100. In example embodiments, in the first and second semiconductor packages 2003a and 2003b, the plurality of semiconductor chips 2200 may be electrically connected to each other by a connection structure including through silicon vias (TSV) instead of the connection structure 2400 for a bonding wire technique.

In example embodiments, the controller 2002 and the plurality of semiconductor chips 2200 may be included in one package. In example embodiments, the controller 2002 and the plurality of semiconductor chips 2200 may be mounted on an additional interposer substrate, which is different from the main substrate 2001, and the controller 2002 may be connected to the plurality of semiconductor chips 2200 by wirings formed on the interposer substrate.

Figure 15:
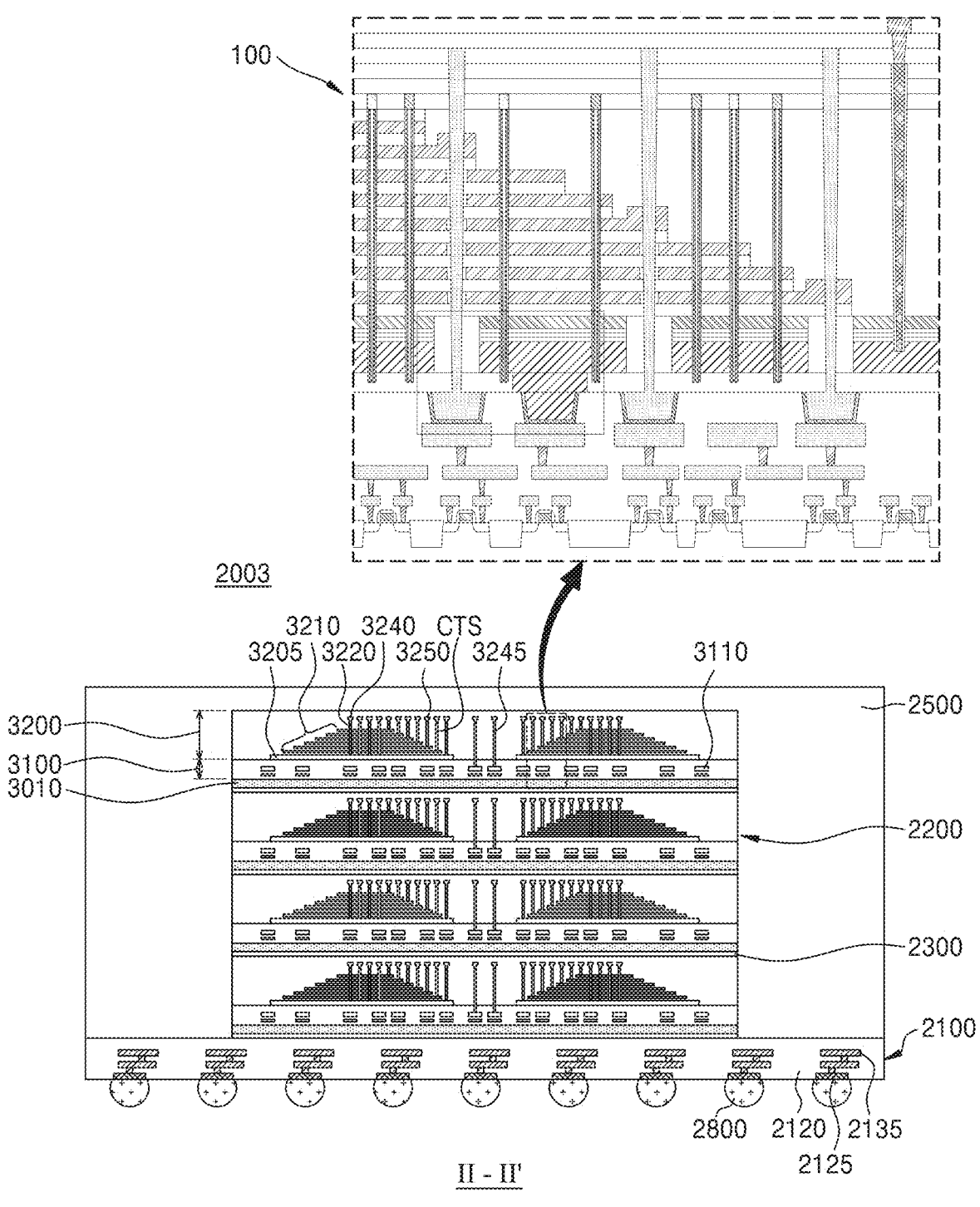
FIG. 15 is a cross-sectional view of semiconductor packages according to example embodiments.

FIG. 15 is a cross-sectional view of semiconductor packages according to example embodiments. FIG. 15 illustrates a detailed configuration taken along line II-II' of FIG. 14.

Referring to FIG. 15, in a semiconductor package 2003, a package substrate 2100 may include a PCB. The package substrate 2100 may include a package substrate body portion 2120, a plurality of package upper pads 2130 (refer to FIG. 14) on a top surface of the package substrate body 2120, a plurality of lower pads 2125 on a bottom surface of the package substrate body portion 2120 or exposed through the bottom surface thereof, and a plurality of internal wirings 2135 configured to electrically connect the plurality of upper pads 2130 to the plurality of lower pads 2125 in the package substrate body portion 2120. The plurality of upper pads 2130 may be electrically connected to a plurality of connection structures 2400, respectively. The plurality of lower pads 2125 may be connected to a plurality of wiring patterns 2005, which are on the main substrate 2001 of the electronic system 2000 shown in FIG. 14, through a plurality of conductive connectors 2800.

Each of a plurality of semiconductor chips 2200 may include a semiconductor substrate 3010 and a first structure 3100 and a second structure 3200, which are sequentially stacked on the semiconductor substrate 3010. The first structure 3100 may include a peripheral circuit area including a plurality of peripheral wirings 3110. The second structure 3200 may include a common source line 3205, a gate stack 3210 on the common source line 3205, a channel structure 3220 passing through the gate stack 3210, a bit line 3240 electrically connected to the channel structure 3220, and gate connection wirings 3250 electrically connected to word lines (refer to WL in FIG. 13) included in the gate stack 3210 through contacts CTS. In example embodiments, each of the plurality of semiconductor chips 2200 may include at least one of the structures of the semiconductor devices 100, 100A, 200, 700, and 800 that have been described with reference to FIGS. 3 to 12.

Each of the plurality of semiconductor chips 2200 may include a through wiring 3245, which is electrically connected to the plurality of peripheral wirings 3110 of the first structure 3100 and extends into the second structure 3200. The through wiring 3245 may be outside the gate stack 3210. In other example embodiments, the semiconductor package 2003 may further including a through wiring configured to pass through the gate stack 3210. Each of the plurality of semiconductor chips 2200 may further include an I/O pad (refer to 2210 in FIG. 14), which is electrically connected to the plurality of peripheral wirings 3110 of the first structure 3100.

Next, a method of manufacturing a semiconductor device, according to example embodiments, will be described in detail FIGS. 16 to 33 are cross-sectional views of a method of manufacturing a semiconductor device, according to example embodiments. Specifically, FIGS. 16 to 19, 20A, 21A, 22A, 23A, 24A, 25, 26, 27A, 28, 29, 30A, 31, 32, and 33 are cross-sectional views of some components of a portion corresponding to the cross-section taken along line X1-X1' of FIG. 4, according to a process sequence. FIGS. 20B, 21B, 22B, 23B, 24B, 27B, and 30B are cross-sectional views of some components of a portion corresponding to the cross-section taken along line Y1-Y1' of FIG. 4, according to a process sequence. An example method of manufacturing the semiconductor device 100 described with reference to FIGS. 4 to 8 will be described with reference to FIGS. 16 to 33.

Figure 16:
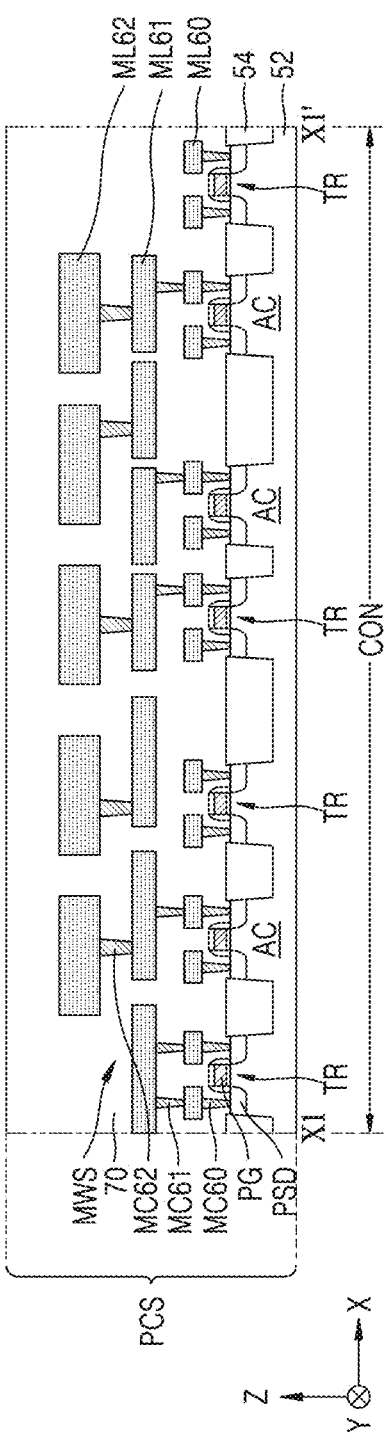

Referring to FIG. 16, a peripheral circuit structure PCS including a substrate 52, a plurality of transistors TR, a multilayered wiring structure MWS, and an interlayer insulating film 70 may be formed. The interlayer insulating film 70 may be formed to cover a plurality of wiring layers ML62, which are uppermost wiring layers from among wiring layers ML60, ML61, and ML62.

Figure 17:
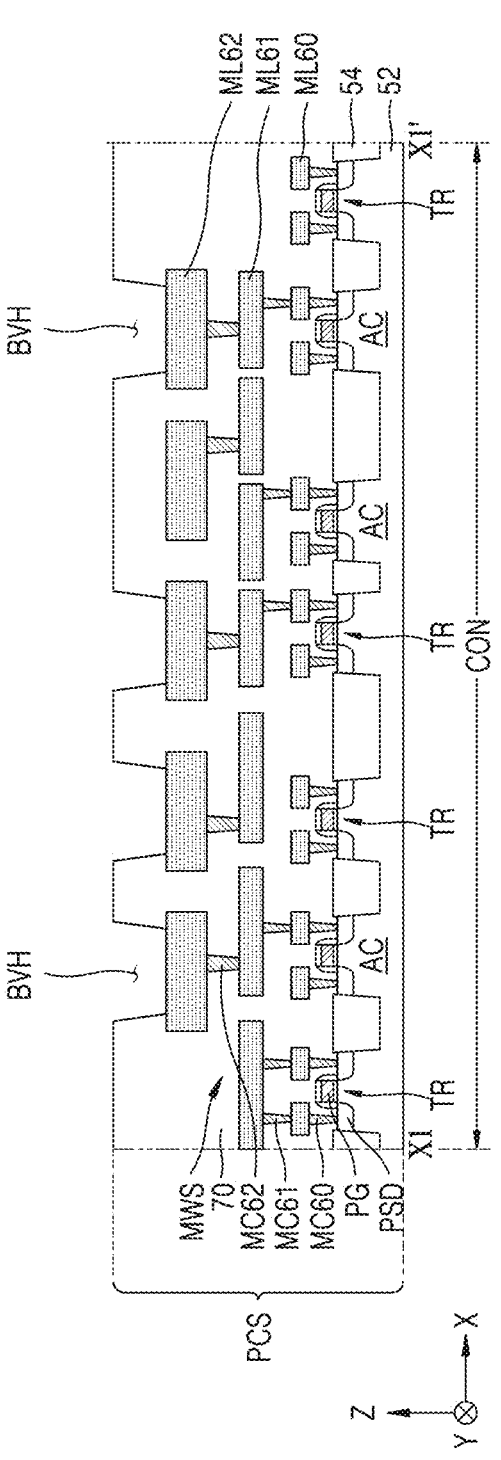

Referring to FIG. 17, a portion of the interlayer insulating film 70 may be etched to form a plurality of via contact holes BVH exposing top surfaces of some wiring layers ML62, which are selected from the plurality of wiring layers ML62.

Figure 18:
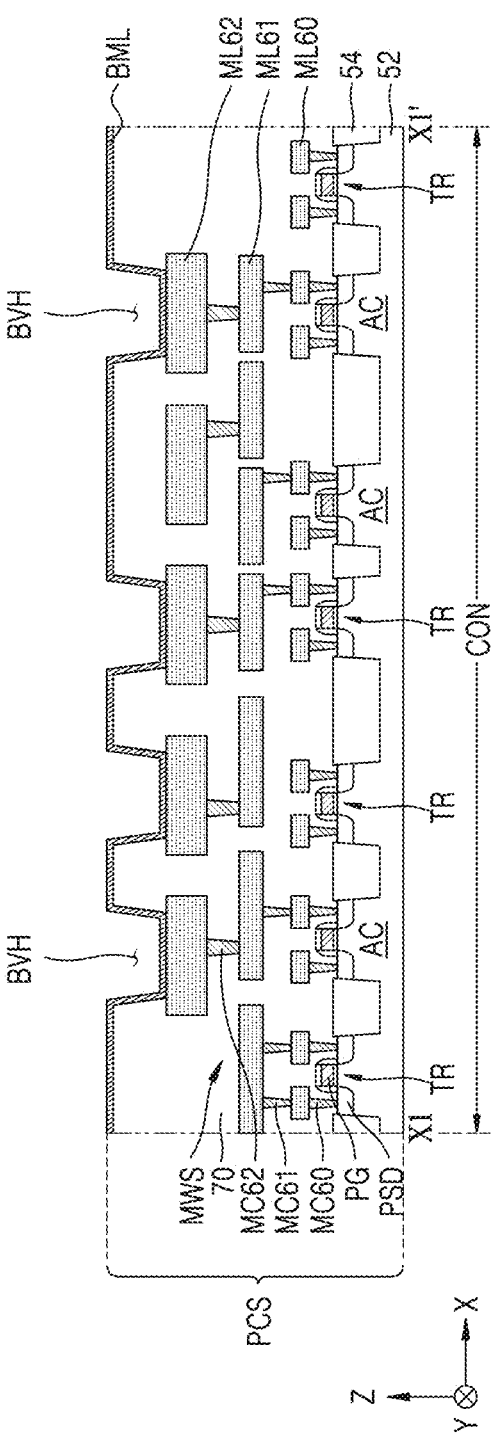

Referring to FIG. 18, a conductive barrier film BML may be formed to conformally cover the exposed surfaces in the resultant structure of FIG. 17. The conductive barrier film BML may include titanium, tantalum, titanium nitride, tantalum nitride, or a combination thereof.

Figure 19:
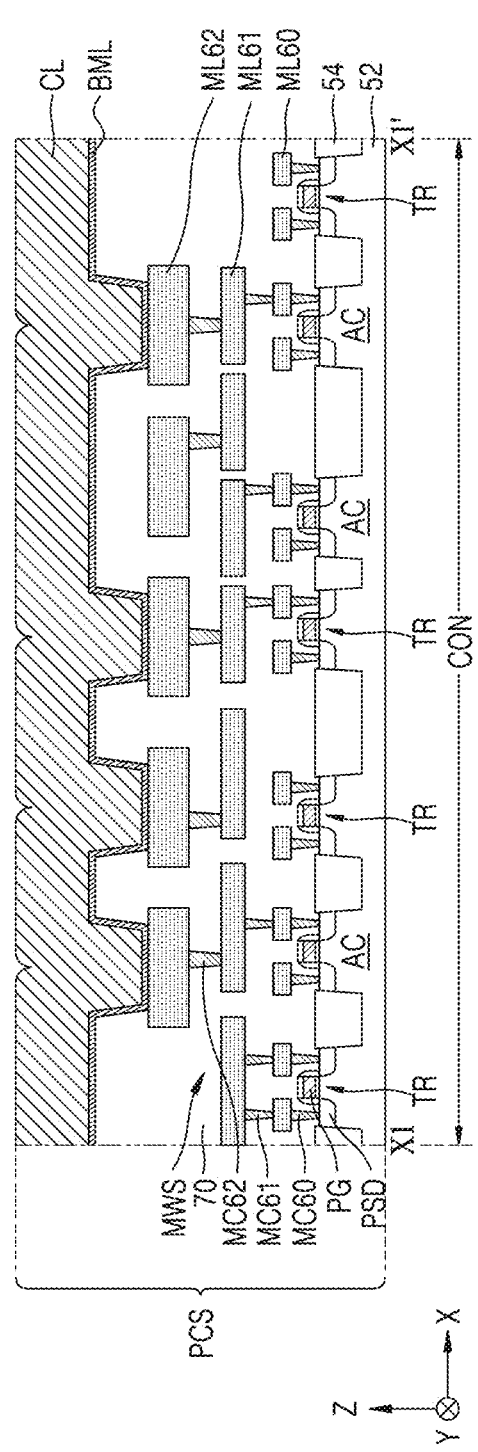

Referring to FIG. 19, on the conductive barrier film BML, a conductive layer CL may be formed to such a sufficient thickness as to fill the plurality of via contact holes BVH. The conductive layer CL may include doped polysilicon, metal silicide, or a combination thereof.

For example, the conductive layer CL may include doped polysilicon.

Figure 20A:
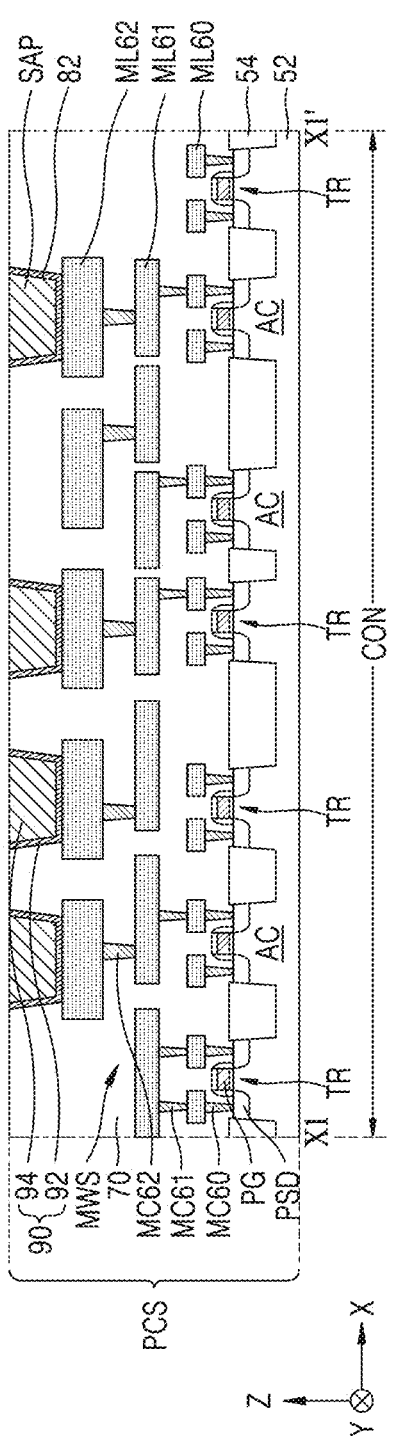
Figure 20B:
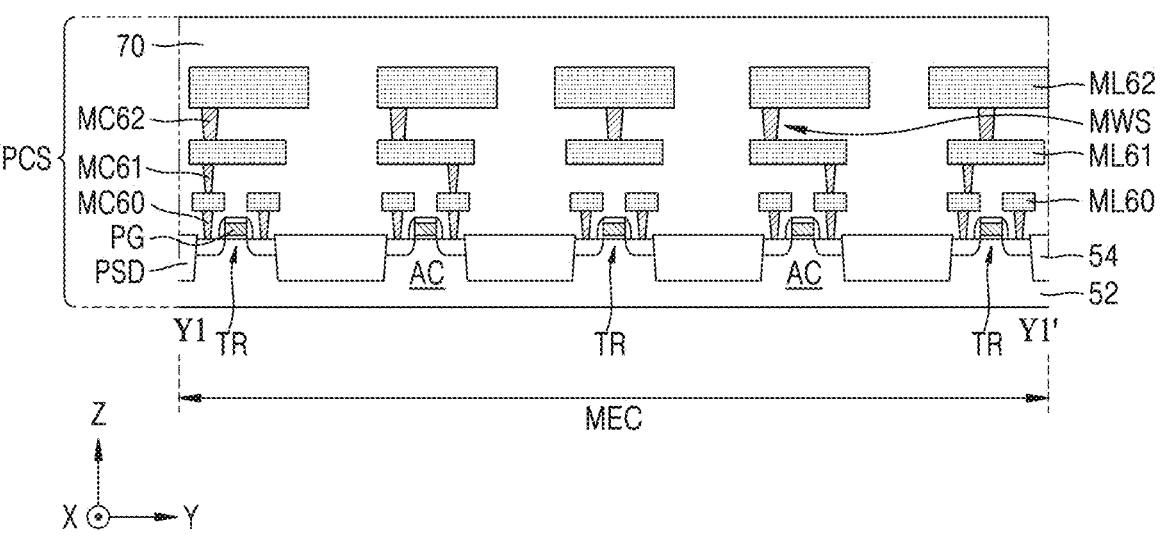
FIGS. 20B, 21B, 22B, 23B, 24B, 27B, and 30B are cross-sectional views of some components of a portion corresponding to the cross-section taken along line Y1-Y1' of FIG. 4, according to a process sequence.

Referring to FIGS. 20A and 20B, in the resultant structure of FIG. 19, portions of the conductive layer CL and the conductive barrier film BML may be removed to leave the conductive layer CL only inside the plurality of via contact holes BVH, and thus, a top surface of the interlayer insulating film 70 may be exposed. As a result, a plurality of first conductive barrier films 82 and a second conductive barrier film 92 may be obtained from portions of the conductive barrier film BML, which remain on the substrate 52, and a plurality of sacrificial patterns SAP and a second contact plug 94 may be obtained from portions of the conductive layer CL, which remain on the substrate 52. Each of the plurality of sacrificial patterns SAP may have a bottom surface and a sidewall, which are surrounded by the first conductive barrier film 82, and the second contact plug 94 may have a bottom surface and a sidewall, which are surrounded by the second conductive barrier film 92.

Figure 21A:
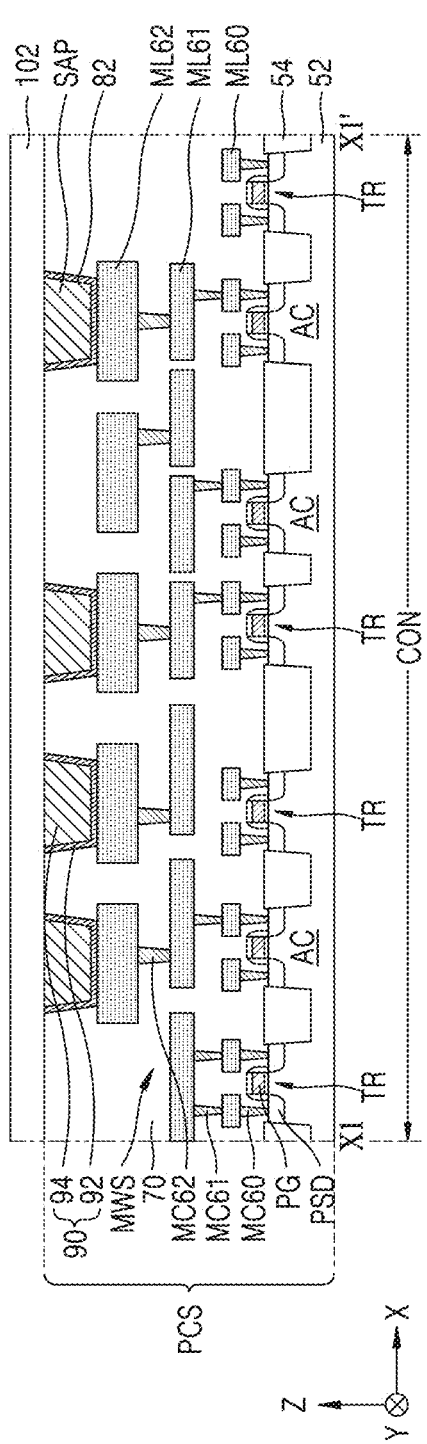
Figure 21B:
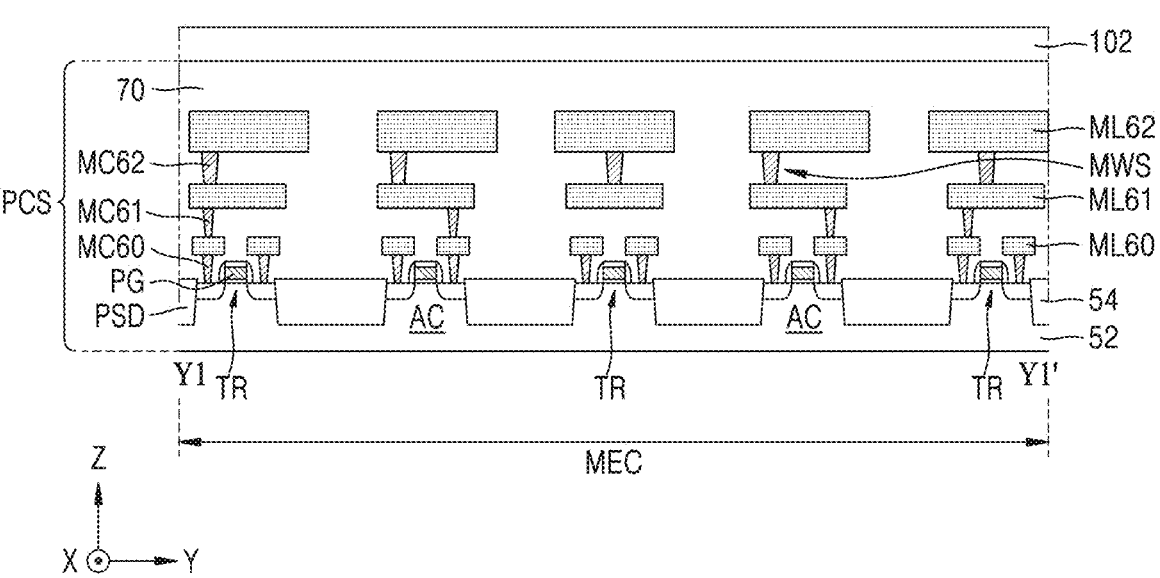

Referring to FIGS. 21A and 21B, a lateral insulating spacer 102 may be formed to cover a top surface of each of the interlayer insulating film 70, the plurality of sacrificial patterns SAP, and the second contact plug 94.

Figure 22A:
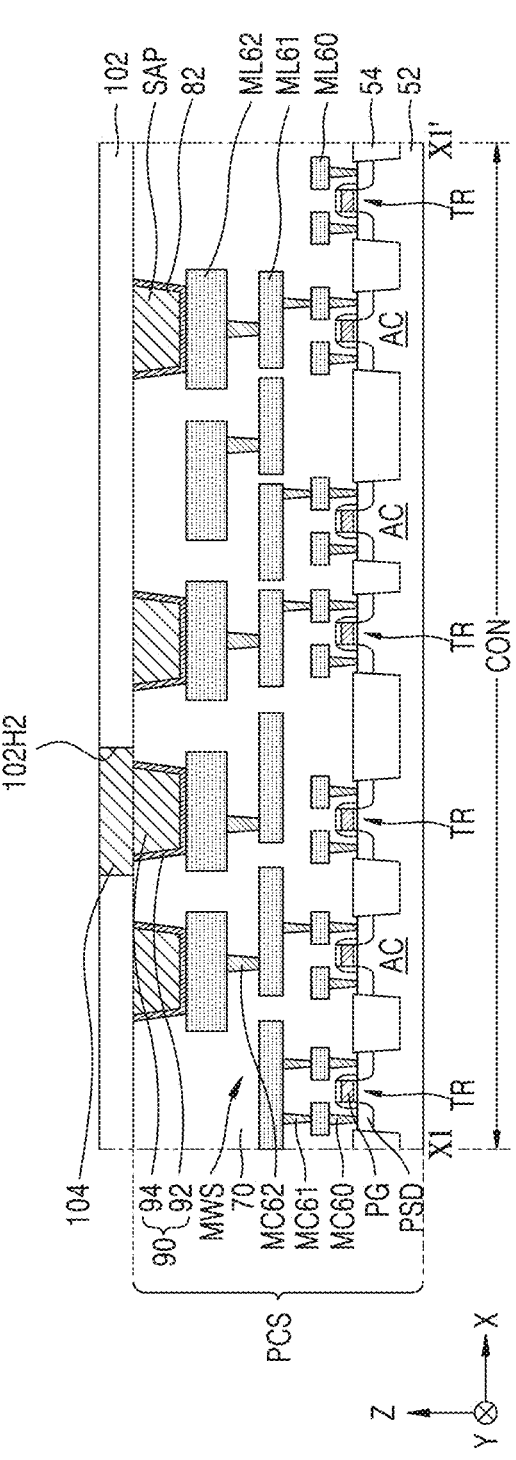
Figure 22B:
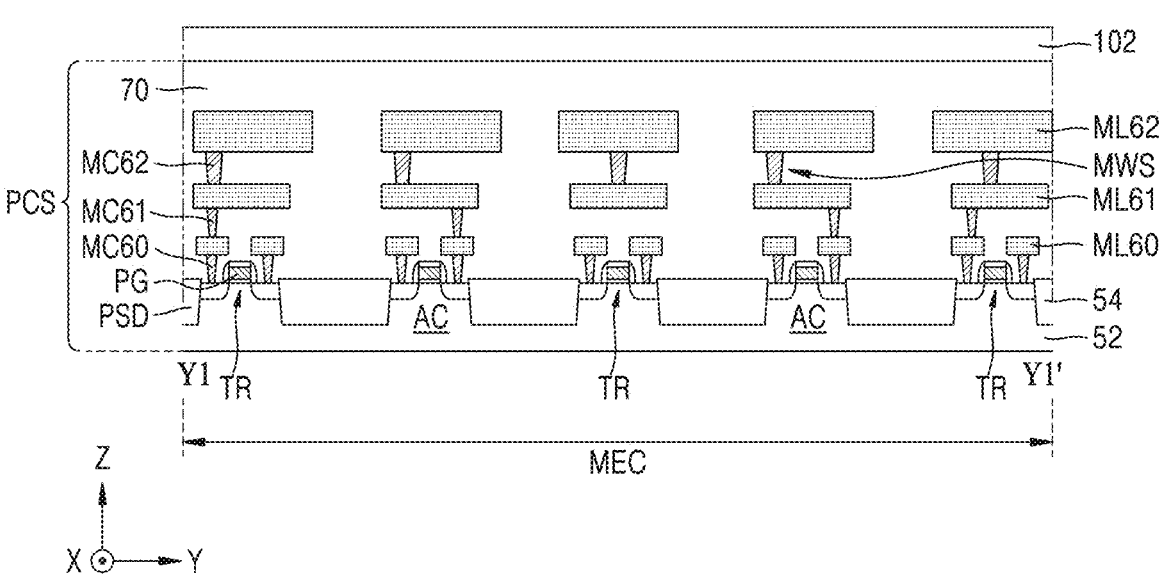

Referring to FIGS. 22A and 22B, a partial region of the lateral insulating spacer 102 may be removed to form a second through opening 102H2 exposing the top surface of the second contact plug 94, and a source line contact 104 may be formed to fill the second through opening 102H2.

Figure 23A:
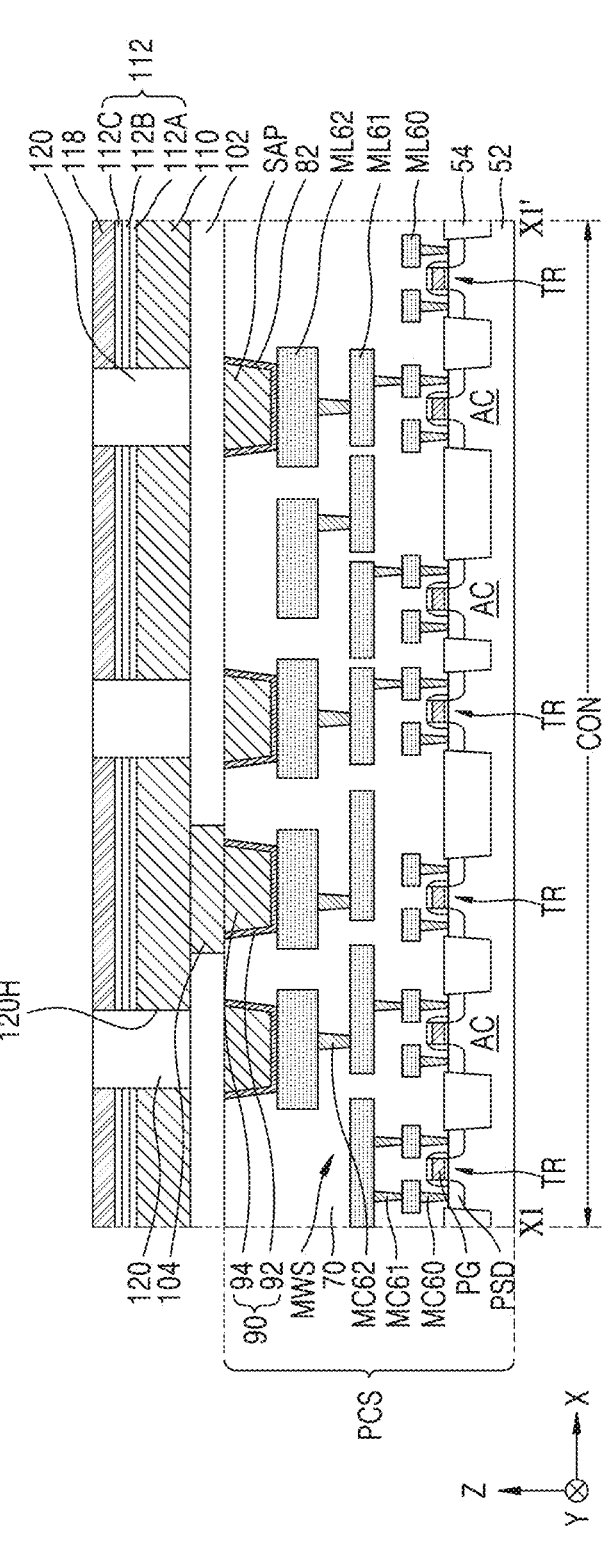
Figure 23B:
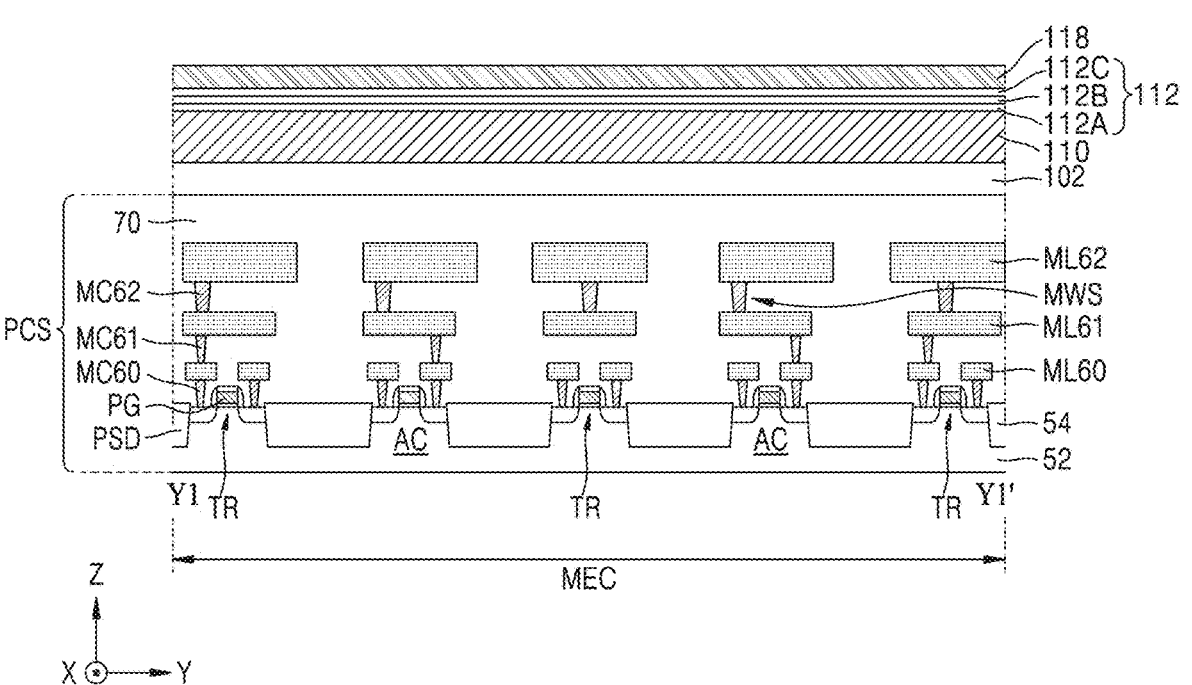

Referring to FIGS. 23A and 23B, a plate common source line 110 may be formed on the resultant structure of FIGS. 22A and 22B, and an insulating plate 112 and a second conductive plate 118 may be sequentially formed to cover the plate common source line 110.

The insulating plate 112 may include an insulating film having a multilayered structure including a first insulating film 112A, a second insulating film 112B, and a third insulating film 112C.

Thereafter, as shown in FIG. 23A, in a partial region of a connection area CON, a plurality of third through openings 120H may be formed to pass through the plate common source line 110, the insulating plate 112, and the second conductive plate 118, and a plurality of insulating plugs 120 may be formed to fill the plurality of third through openings 120H.

Figure 24A:
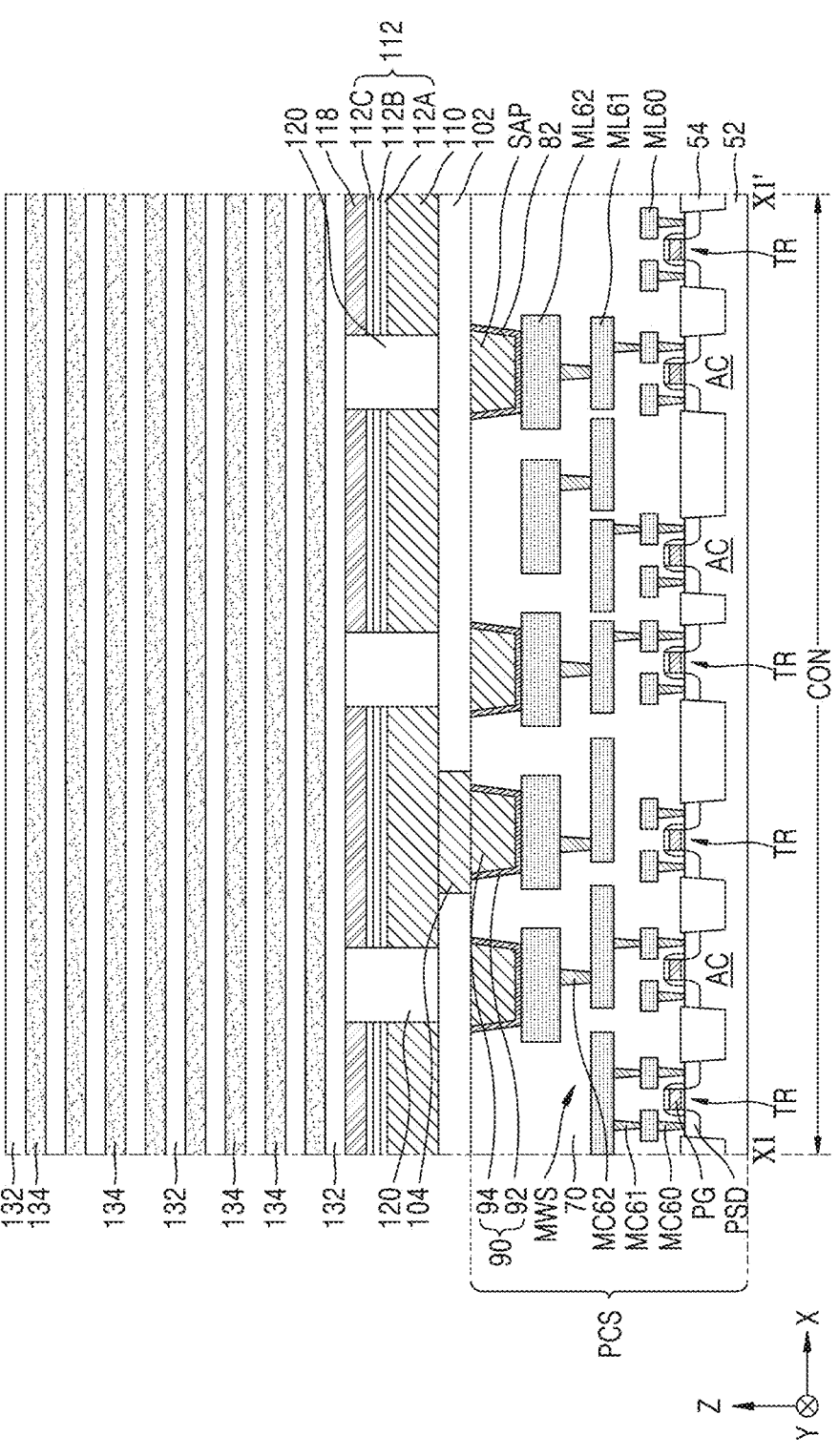
Figure 24B:
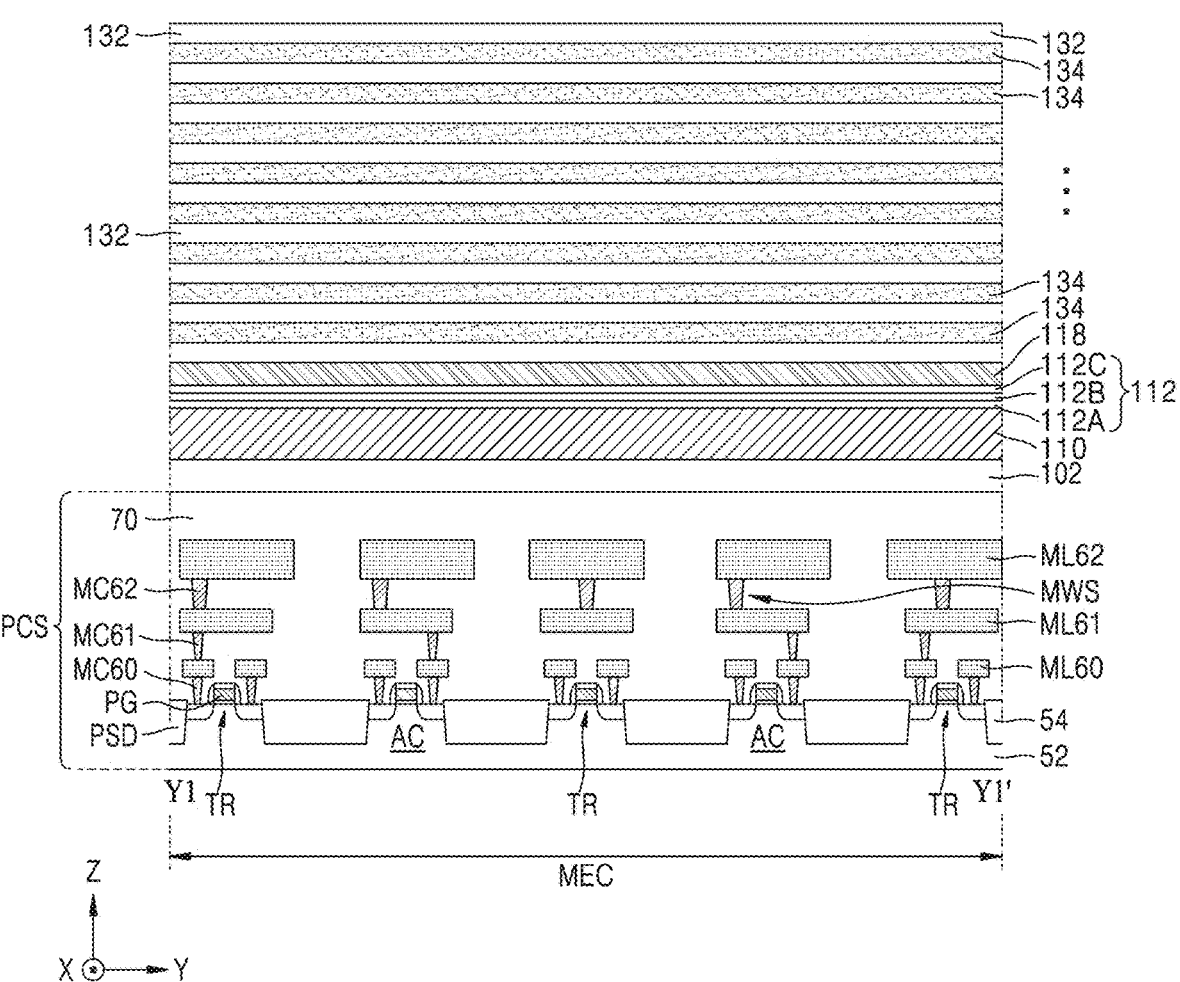

Referring to FIGS. 24A and 24B, in the memory cell area MEC and the connection area CON, a plurality of insulating films 132 and a plurality of sacrificial insulating films 134 may be alternately stacked one-by-one on the second conductive plate 118) and the insulating plug 120. The plurality of insulating films 132 may include a silicon oxide film, and the plurality of sacrificial insulating films 134 may include silicon nitride. Each of the plurality of sacrificial insulating films 134 may ensure a space for forming a plurality of gate lines 130 in a subsequent process.

Figure 25:
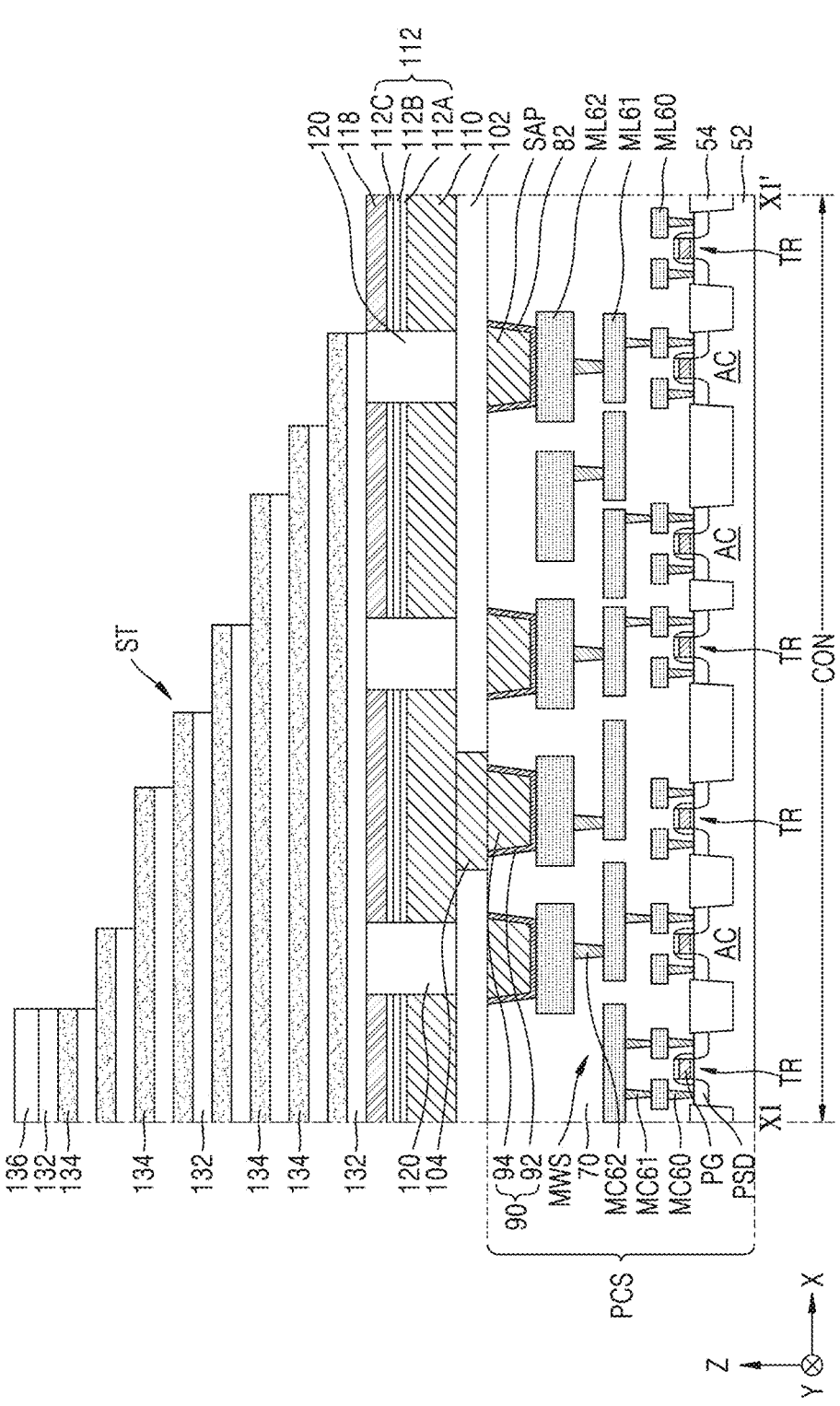

Referring to FIG. 25, in the resultant structure of FIGS. 24A and 24B, an etch stop film 136 may be formed to cover an uppermost one of the plurality of insulating films 132, and then a portion of each of the plurality of insulating films 132 and the plurality of sacrificial insulating films 134 may be removed from the connection area CON by using a photolithography process, thereby forming a staircase structure ST. In the staircase structure ST, one end of each of the plurality of insulating films 132 and the plurality of sacrificial insulating films 134 may have a gradually smaller width in a direction away from the plate common source line 110 in a lateral direction.

Figure 26:
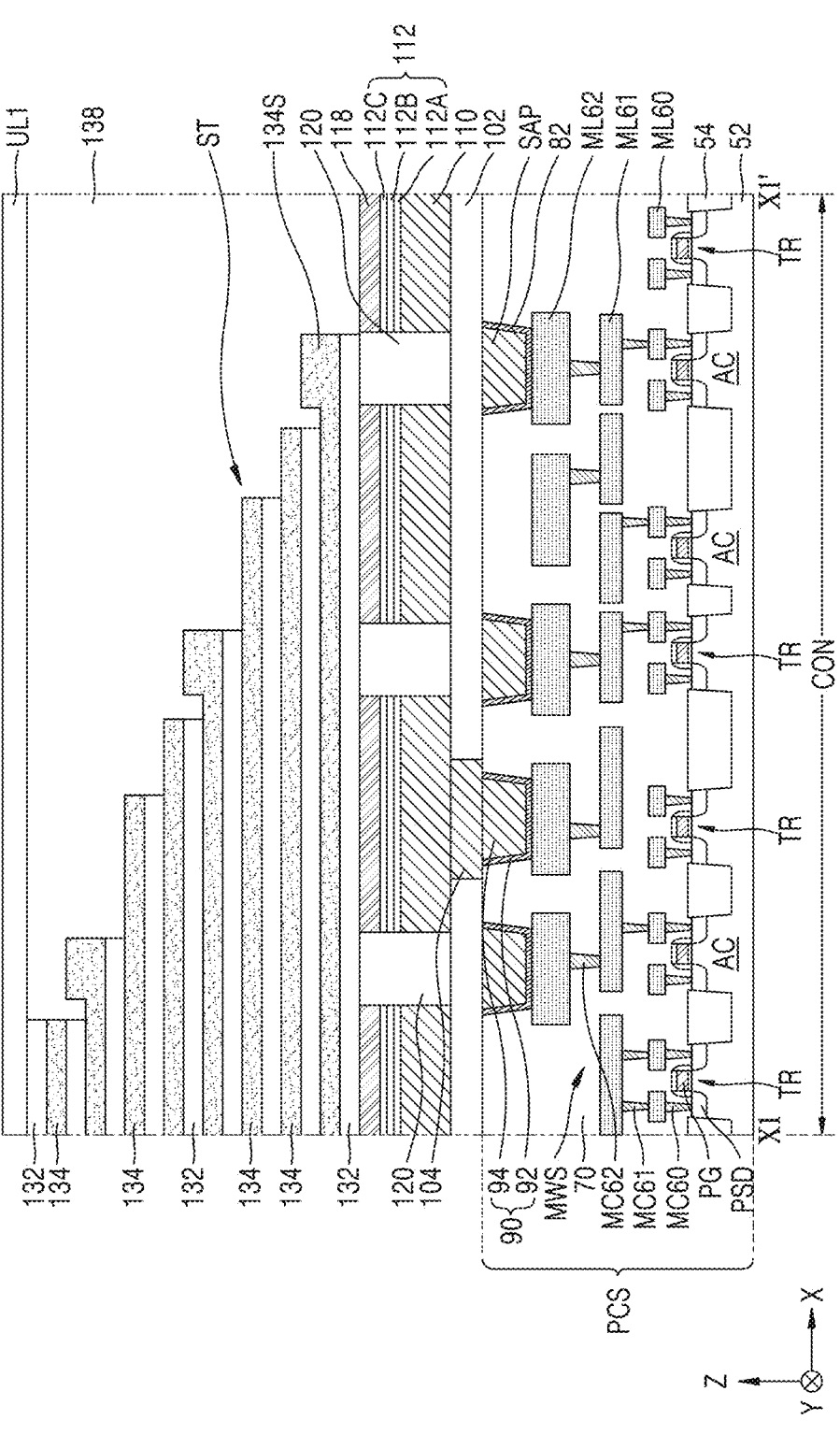

Referring to FIG. 26, in the resultant structure of FIG. 25, a sacrificial pad portion 134S having an increased thickness may be formed at one end of each of the plurality of sacrificial insulating films 134 included in the staircase structure ST. Although only the sacrificial pad portion 134S formed at one end of each of the plurality of sacrificial insulating films 134 is illustrated in FIG. 26, the sacrificial insulating film 134, which is not connected to the sacrificial pad portion 134S in FIG. 26, may be connected to the sacrificial pad portion 134S in another portion that is invisible in FIG. 26.

In example embodiments, to form the sacrificial pad portion 134S at one end of each of the plurality of sacrificial insulating films 134, portions of the plurality of insulating films 132 may be removed to expose one end of each of the plurality of sacrificial insulating films 134 included in the staircase structure ST. Thereafter, an additional film may be deposited on the exposed end of each of the plurality of sacrificial insulating films 134. The additional film may include the same material as a constituent material of the plurality of sacrificial insulating films 134. The additional film may be patterned to leave the sacrificial pad portion 134S.

Thereafter, an interlayer insulating film 138 may be formed to cover the staircase structure ST and the second conductive plate 118. The obtained resultant structure may be planarized using a chemical mechanical polishing (CMP) process to expose a top surface of the uppermost one of the insulating films 132. The etch stop film 136 may be removed during the planarization process. Subsequently, a first upper insulating film UL1 may be formed to cover the top surface of the uppermost one of the insulating films 132 and a top surface of the interlayer insulating film 138.

Figure 27A:
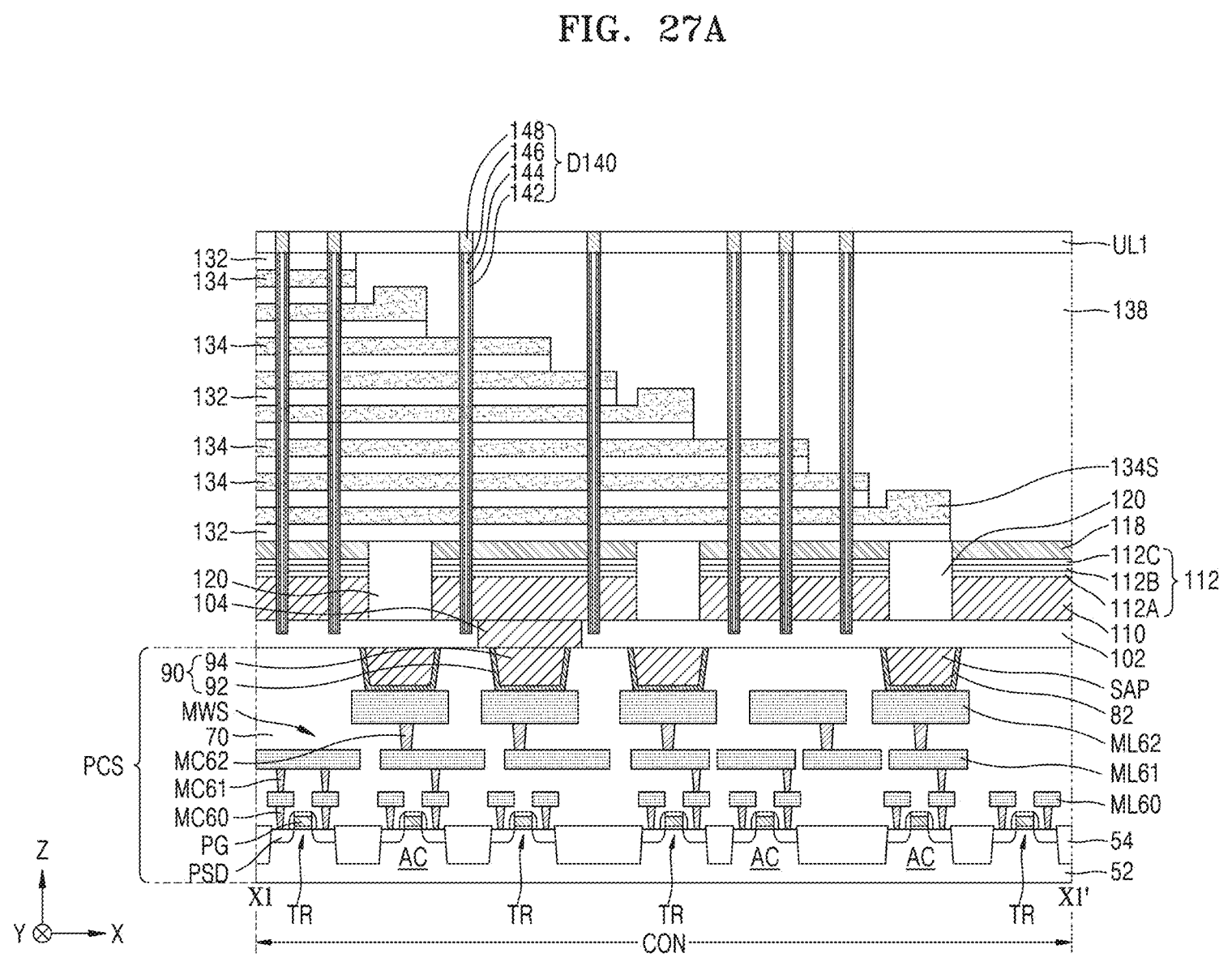
Figure 27B:
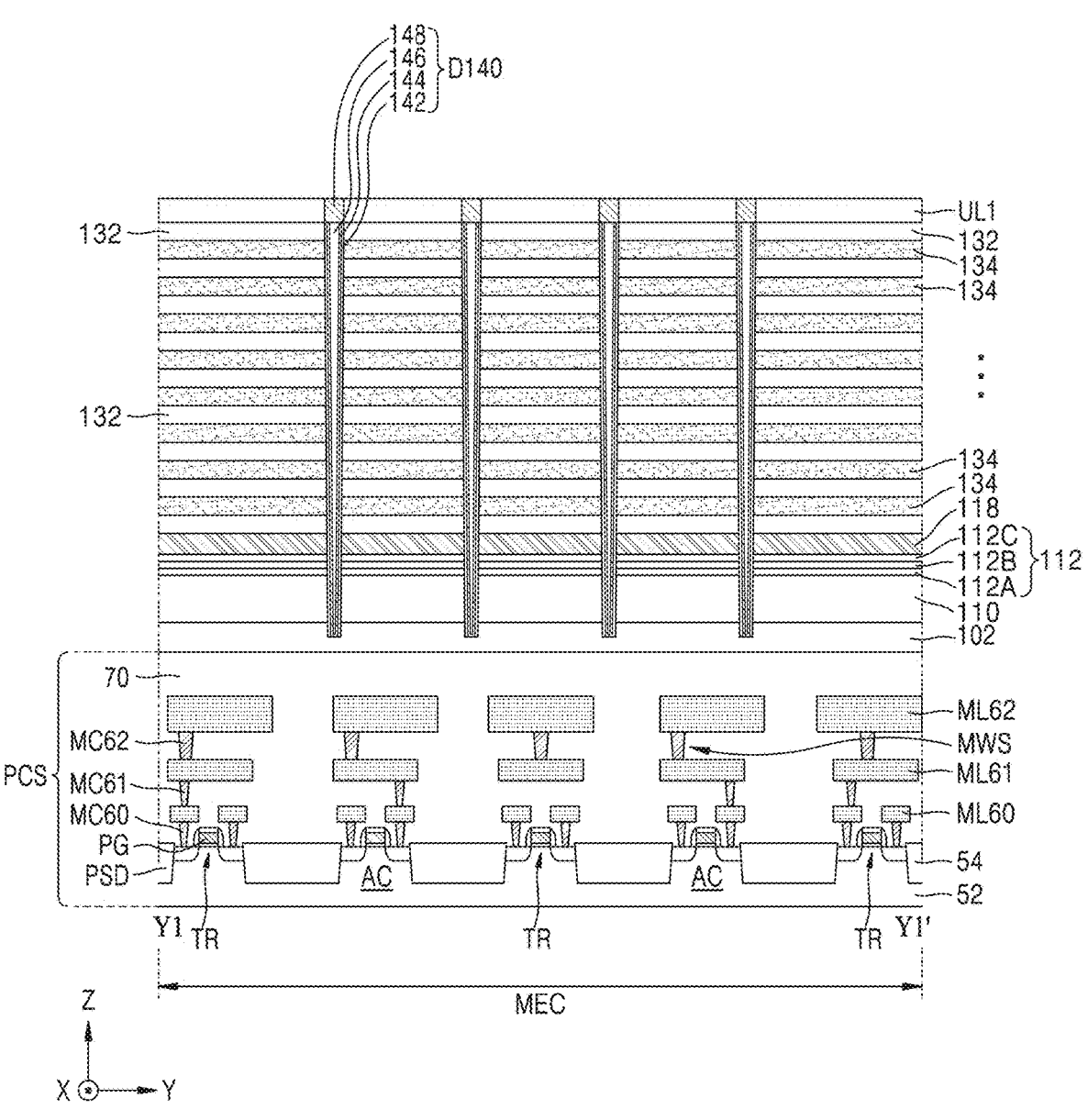

Referring to FIGS. 27A and 27B, in the memory cell area MEC, a plurality of channel structures 140 may be formed through the first upper insulating film UL1, the plurality of insulating films 132, and the plurality of sacrificial insulating films 134 and extend long in the vertical direction (Z direction). Also, in the connection area CON, the plurality of dummy channel structures D140 may be formed through the first upper insulating film UL1, the plurality of insulating films 132, the plurality of sacrificial insulating films 134, and the interlayer insulating film 138 and extend long in the vertical direction (Z direction). Each of the plurality of channel structures 140 and the plurality of dummy channel structures D140 may be formed to include a portion in contact with the lateral insulating spacer 102.

Figure 28:
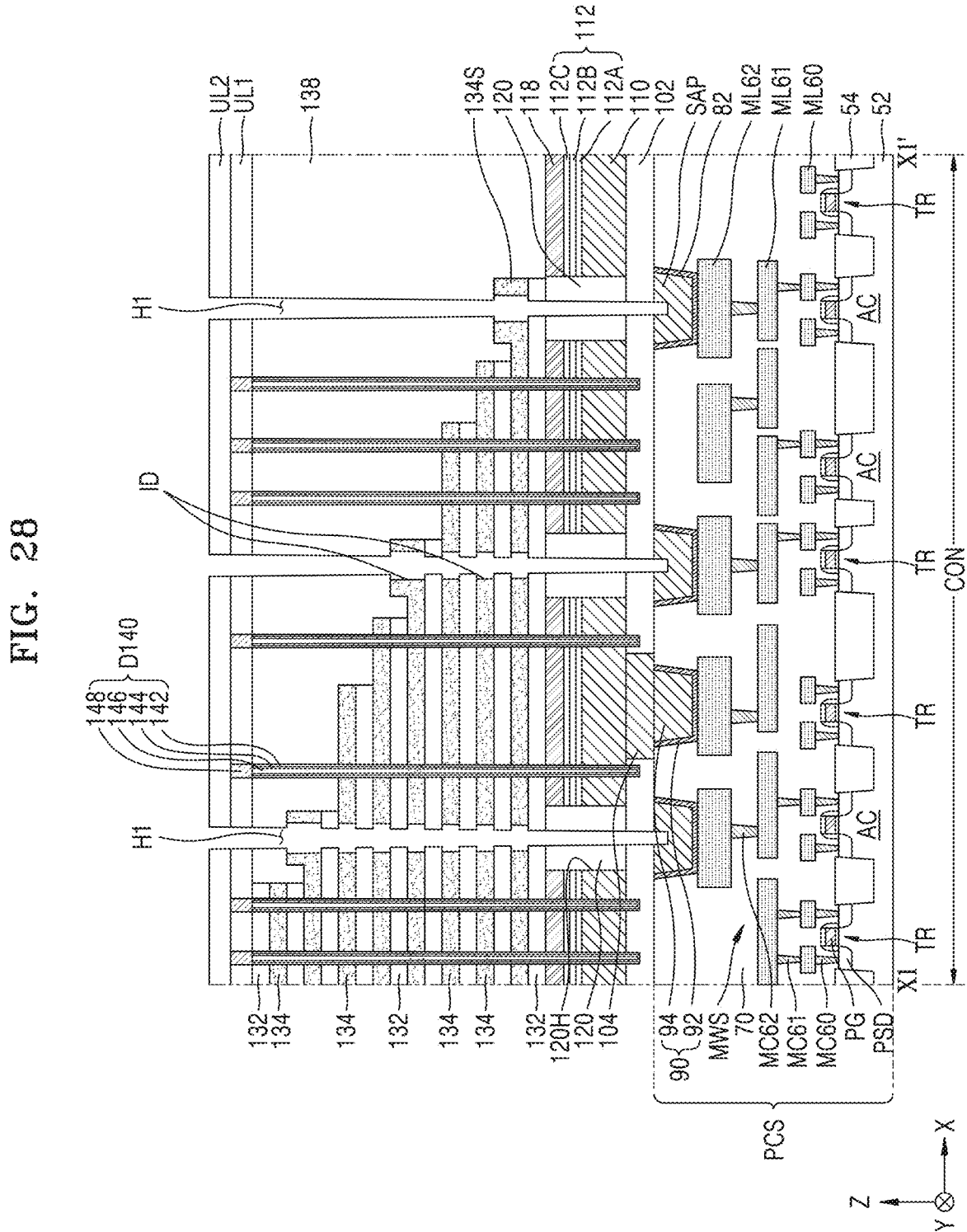

Referring to FIG. 28, a second upper insulating film UL2 may be formed on the resultant structure of FIGS. 27A and 27B, and a plurality of vertical holes H1 may be then formed in the connection area CON. The sacrificial pattern SAP may be exposed at a bottom surface of each of the plurality of vertical holes H1.

The plurality of vertical holes Ill may pass through the second upper insulating film UL2, the first upper insulating film UL1, the interlayer insulating film 138, one sacrificial pad portion 134S, the plurality of sacrificial insulating films 134, the plurality of insulating films 132, the insulating plug 120, and the lateral insulating spacer 102 in the vertical direction (Z direction) and expose the sacrificial pattern SAP.

Thereafter, portions of the sacrificial pad portion 134S and the sacrificial insulating film 134, which are respectively exposed inside the plurality of vertical holes H1, may be etched, and thus, a lateral width of each of the plurality of vertical holes H1 may be expanded at the same vertical level as the sacrificial insulating film 134. As a result, a plurality of indent spaces ID exposing sidewalls of the sacrificial pad portion 134S and the sacrificial insulating film 134 may be formed.

Figure 29:
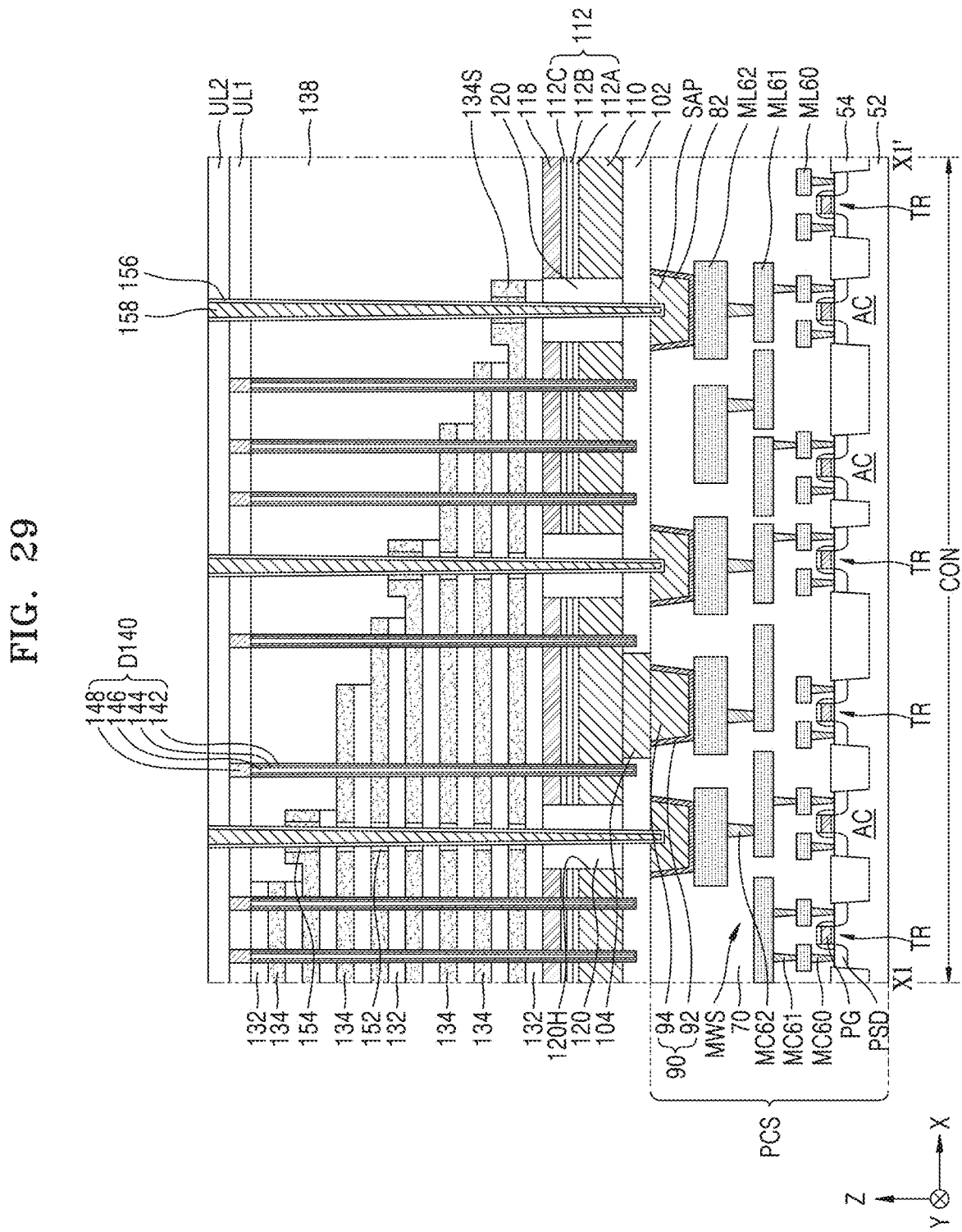

Referring to FIG. 29, in the resultant structure of FIG. 28, from among a plurality of indent spaces ID connected to the plurality of vertical holes H1, an indent space ID exposing the sacrificial insulating film 134 may be filled with an insulating ring 152, and an indent space ID exposing the sacrificial pad portion 134S may be filled with a sacrificial insulating ring 154. The insulating ring 152 may include a silicon oxide film. The sacrificial insulating ring 154 may include the same material (e.g., a silicon nitride film) as the sacrificial insulating film 134.

In example embodiments, after the insulating ring 152 is firstly formed in the indent space ID exposing the sacrificial insulating film 134 inside each of the plurality of vertical holes H1, the sacrificial insulating ring 154 may be formed in the indent space ID exposing the sacrificial pad portion 134S inside each of the plurality of vertical holes H1. In example embodiments, an etch stop insulating liner (not shown) may be between the sacrificial insulating film 134 and the insulating ring 152. The etch stop insulating liner may include a silicon nitride film.

Thereafter, the inside of each of the plurality of vertical holes H1 may be filled with an insulating spacer 156 and a sacrificial plug 158. In example embodiments, the insulating spacer 156 may include silicon oxide, and the sacrificial plug 158 may include polysilicon, without being limited thereto.

Figure 30A:
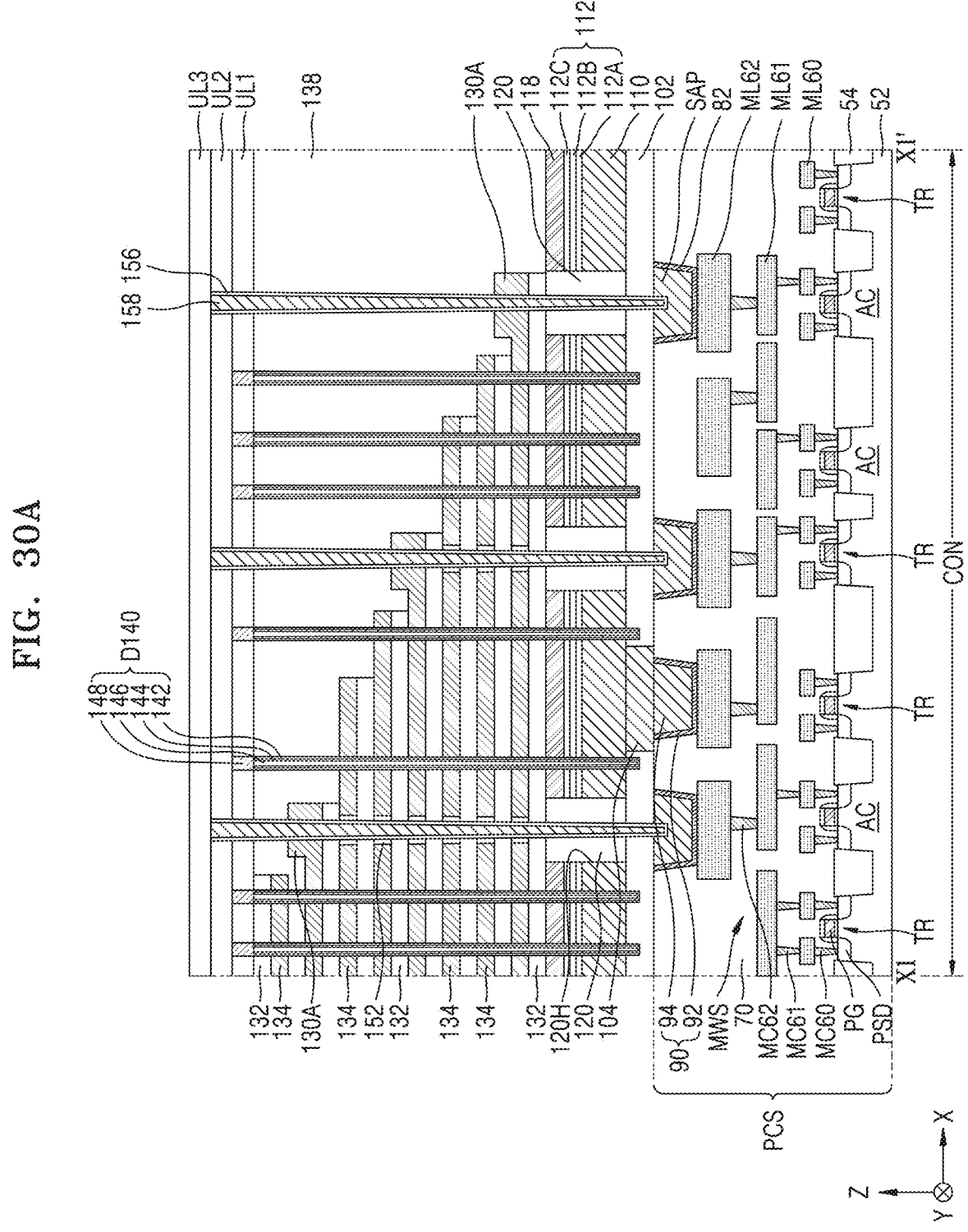
Figure 30B:
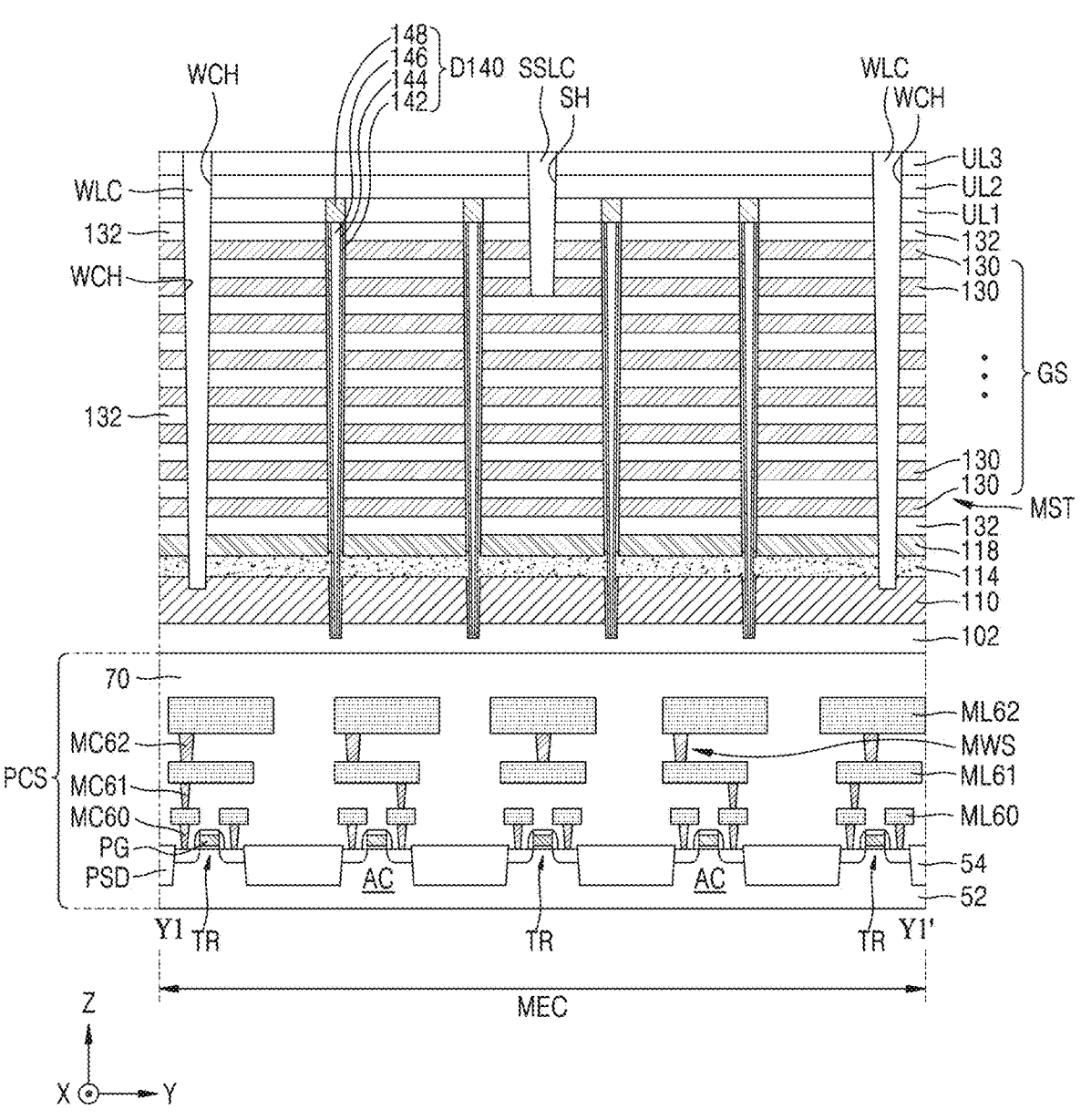

Referring to FIGS. 30A and 30B, in the memory cell area MEC and the connection area CON, a third upper insulating film UL3 may be formed to cover a top surface of each of the insulating spacer 156, the sacrificial plug 158, and the second upper insulating film UL2.

In the memory cell area MEC of the resultant structure including the third upper insulating film UL3, the third upper insulating film UL3, the second upper insulating film UL2, the first upper insulating film UL1, some of the plurality of insulating films 132, and some of the plurality of sacrificial insulating films 134 may be etched to form a hole SH, and a string selection line cut structure SSLC may be formed to fill the hole SH.

In the memory cell area MEC and the connection area CON, a plurality of word line cut holes WCH may be formed to pass through the third upper insulating film UL3, the second upper insulating film UL2, the first upper insulating film UL1, the interlayer insulating film 138, the plurality of insulating films 132, the plurality of sacrificial insulating films 134, the second conductive plate 118, and the insulating plate 112 and expose the plate common source line 110.

The insulating plate 112 may be selectively removed through an inner space of each of the plurality of word line cut holes WCH only in the memory cell area MEC, from among the memory cell area MEC and the connection area CON. The resultant vacant space may be filled with a first conductive plate 114. During the removal of the insulating plate 112 from the memory cell area MEC, in the memory cell area MEC, portions of a gate dielectric film 182 of a channel structure 180, which are adjacent to the insulating plate 112, may be removed together with the insulating plate 112. As a result, the first conductive plate 114 may pass through a partial region of the gate dielectric film 182 in a lateral direction and come into contact with the channel region 184.

In the memory cell area MEC and the connection area CON, the plurality of sacrificial insulating films 134 and the sacrificial pad portion (see 134S in FIG. 29) may be replaced by the plurality of gate lines 130 through the respective inner spaces of the plurality of word line cut holes WCH. In each of the plurality of gate lines 130, a relatively thick end obtained by replacing the sacrificial pad portion 134S may constitute the gate pad portion 130A.

After the first conductive plate 114 and the plurality of gate lines 130 are formed, the plurality of word line cut holes WCH may be filled with the plurality of word line cut structures WLC.

Figure 31:
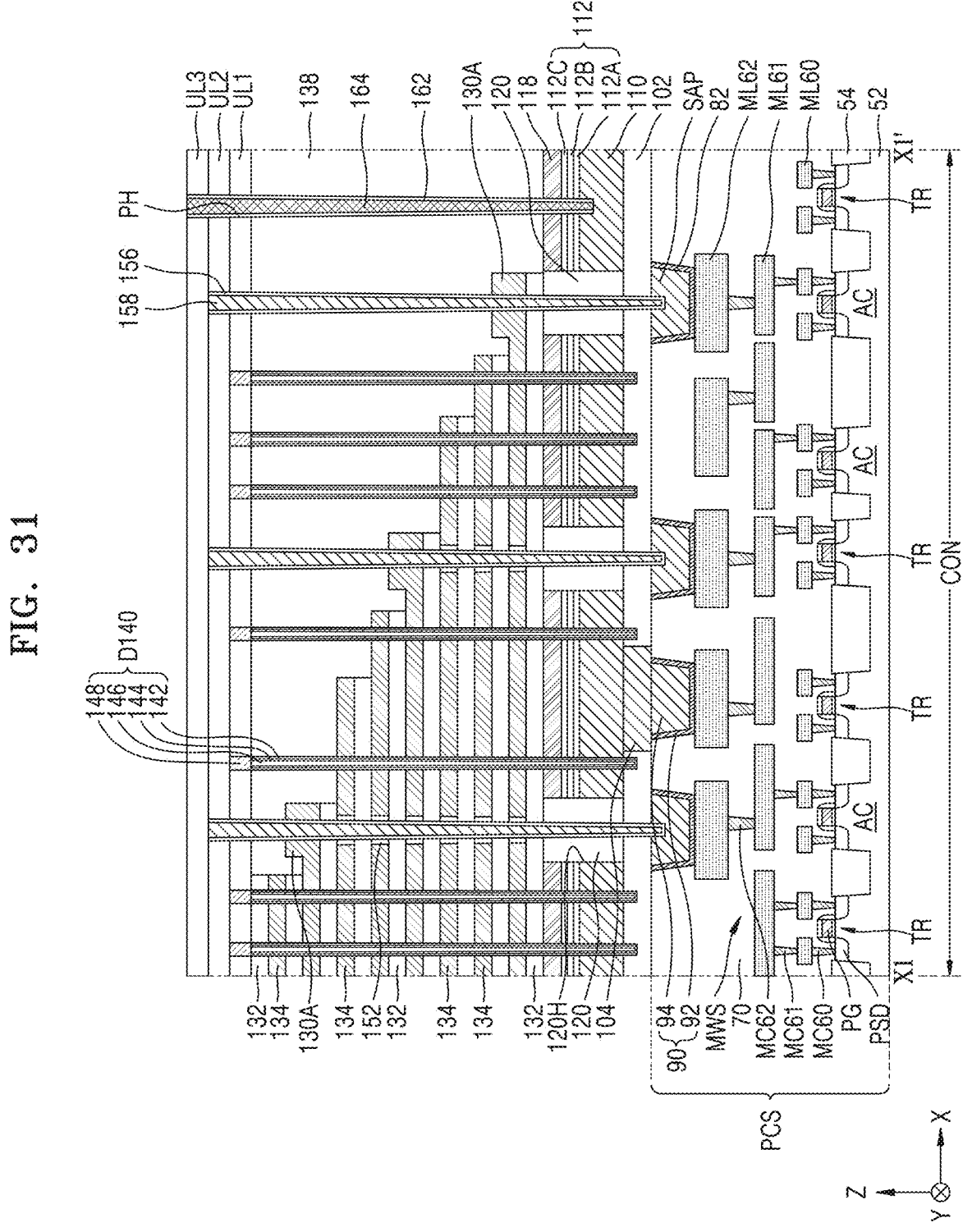

Referring to FIG. 31, in the connection area CON of the resultant structure of FIGS. 30A and 30B, a hole PH may be formed to pass through the third upper insulating film UL3, the second upper insulating film UL2, the first upper insulating film UL1, the interlayer insulating film 138, the second conductive plate 118, and the insulating plate 112 and expose the plate common source line 110. Thereafter, an insulating spacer 162 and a conductive plate contact 164 may be sequentially formed inside the hole PHI.

Figure 32:
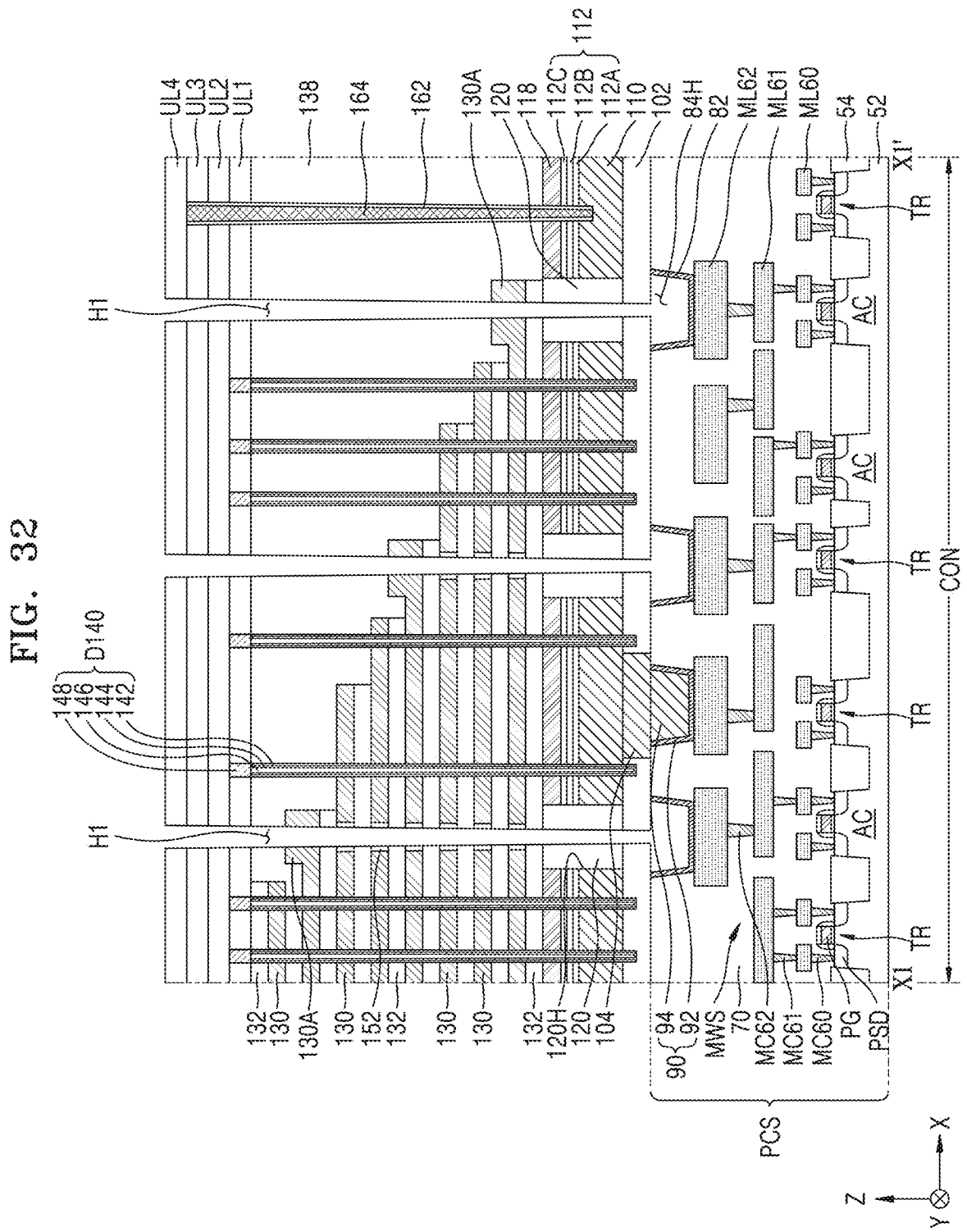

Referring to FIG. 32, in the connection area CON of the resultant structure of FIG. 31, a fourth upper insulating film UL4 may be formed to cover the third upper insulating film UL3, the insulating spacer 162, and the conductive plate contact 164. Thereafter, a portion of each of the fourth upper insulating film UL4 and the third upper insulating film UL3 may be removed to expose the insulating spacer 156 and the sacrificial plug 158. Afterwards, the insulating spacer 156 and the sacrificial plug 158, which are exposed, may be removed. Subsequently, the plurality of sacrificial patterns (see SAP in FIG. 31) may be removed through the plurality of vertical holes III. By removing the plurality of sacrificial patterns SAP, a plurality of contact spaces 8411, which are connected to the plurality of vertical holes H1 and defined by the first conductive barrier film 82, may be formed.

Figure 33:
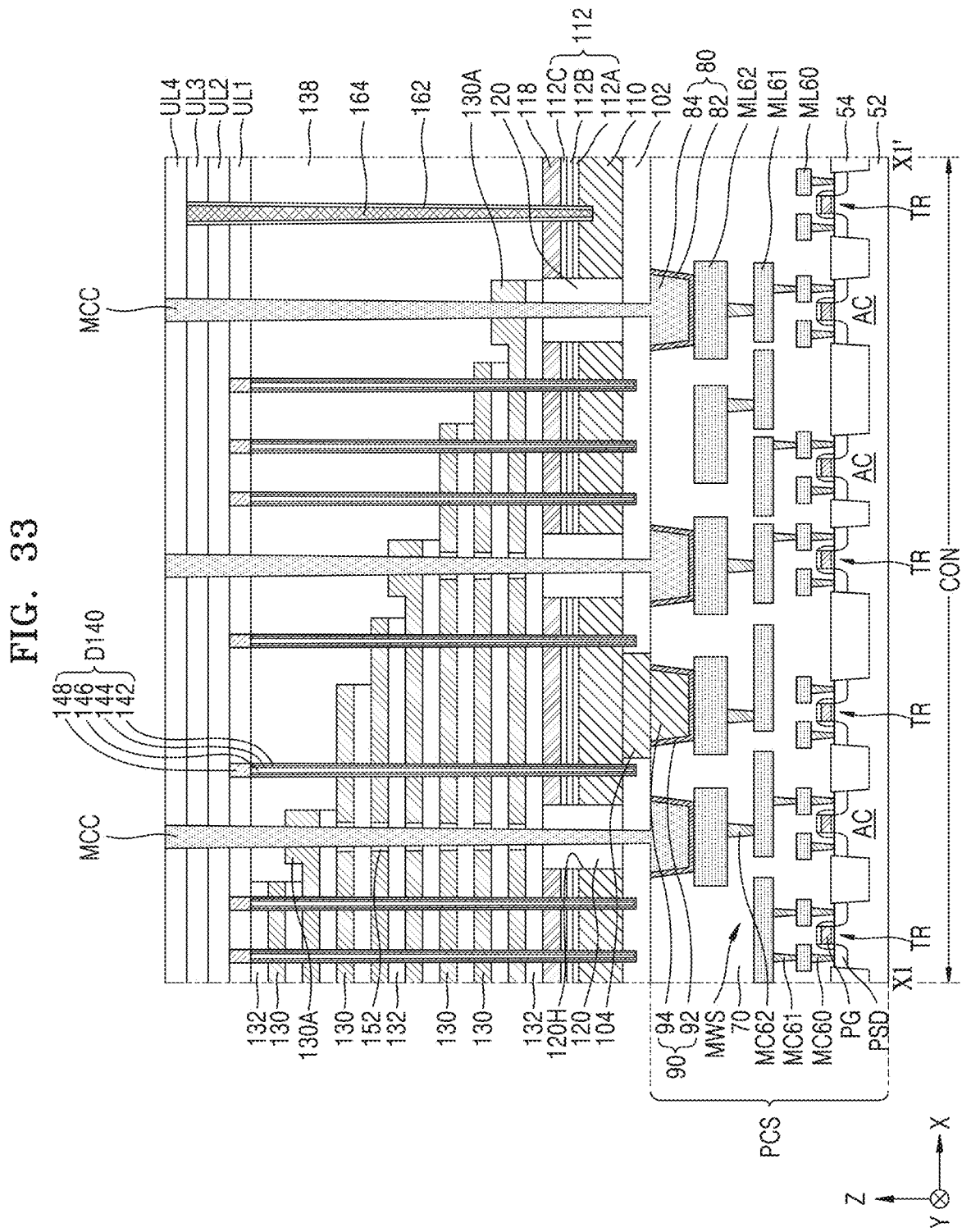

Referring to FIG. 33, in the connection area CON of the resultant structure of FIG. 32, a plurality of memory cell contacts MCC may be formed to fill the plurality of vertical holes H1 and simultaneously, a plurality of first contact plugs 84 may be formed to fill the plurality of contact spaces 84H.

Thereafter, as shown in FIGS. 5 and 6, a fifth upper insulating film UL5 may be formed on the resultant structure of FIG. 33 to cover the memory cell area MEC and the connection area CON. In the connection area CON, a contact plug 172 may be formed through the fifth upper insulating film UL5 and the fourth upper insulating film UL4 and connected to the conductive plate contact 164. In the memory cell area MEC, a plurality of contact plugs 176 may be formed through the fifth upper insulating film UL5, the fourth upper insulating film UL4, the third upper insulating film UL3, and the second upper insulating film UL2 and connected to drain regions 148 of the plurality of channel structures 140.

Afterwards, a plurality of upper wiring layers UML may be formed on the fifth upper insulating film UL5 in the connection area CON, and a plurality of bit lines BL may be formed on the fifth upper insulating film UL5 in the memory cell area MEC. Also, a sixth upper insulating film UL6 may be formed to fill respective spaces between the plurality of upper wiring layers UML and the plurality of bit lines BL.

Although the method of manufacturing the semiconductor device 100 shown in FIGS. 4 to 8 has been described with reference to FIGS. 16 to 33, it will be understood that the semiconductor devices 100A, 200, 700, and 800 shown in FIGS. 9 to 12 and semiconductor devices having variously changed structures may be manufactured by applying various modifications and changes to the processes described with reference to FIGS. 16 to 33 within the scope of the inventive concepts.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While the inventive concepts have been particularly shown and described with reference to example embodiments thereof, it will be understood that various changes in form and details may be made therein without departing from the spirit and scope of the following claims.

What is claimed is:

1. A semiconductor device comprising:
a peripheral circuit structure comprising a plurality of circuits, a plurality of wiring layers, and a plurality of via contacts on the plurality of wiring layers, the plurality of via contacts being apart from each other in a lateral direction;
a plate common source line covering the peripheral circuit structure;
an insulating plug passing through the plate common source line in a vertical direction;
a lateral insulating spacer between the peripheral circuit structure and the plate common source line;
a memory stack structure comprising a plurality of gate lines on the plate common source line, the plurality of gate lines overlapping each other in the vertical direction;
a through contact passing through at least one of the plurality of gate lines and the insulating plug in the vertical direction, the through contact being connected to a first via contact selected from the plurality of via contacts; and
a source line contact passing through the lateral insulating spacer in the vertical direction, the source line contact being between a second via contact selected from the plurality of via contacts and the plate common source line,
wherein a width of the first via contact is greater than a width of the insulating plug in the lateral direction, and
wherein the first via contact and the second via contact comprise different materials from each other.

2. The semiconductor device of claim 1, wherein a bottom surface of the source line contact is in contact with a top surface of the second via contact, and a top surface of the source line contact is in contact with a bottom surface of the plate common source line.

3. The semiconductor device of claim 1, wherein the second via contact, the source line contact, and the plate common source line comprise the same material as each other.

4. The semiconductor device of claim 1, wherein the first via contact comprises a first conductive barrier film and a first contact plug having a bottom surface and a sidewall, which are surrounded by the first conductive barrier film,
the second via contact comprises a second conductive barrier film and a second contact plug having a bottom surface and a sidewall, which are surrounded by the second conductive barrier film, the first conductive barrier film and the second conductive barrier film comprise the same material as each other, and the first contact plug and the second contact plug comprise different materials from each other.

5. The semiconductor device of claim 1, wherein each of the first via contact and the through contact comprises a metal, and the source line contact does not comprise a metal.

6. The semiconductor device of claim 1, wherein the first via contact is connected to at least one of the plurality of circuits, and the second via contact is grounded.

7. A semiconductor device comprising:

a peripheral circuit structure comprising a plurality of wiring layers, a first via contact, and a second via contact, the first via contact being connected to a first wiring layer selected from the plurality of wiring layers, the second via contact being connected to a second wiring layer selected from the plurality of wiring layers, wherein the second via contact is apart from the first via contact in a lateral direction;

a lateral insulating spacer covering the peripheral circuit structure, the lateral insulating spacer comprising a first through opening and a second through opening, the first through opening overlapping the first via contact in a vertical direction, the second through opening overlapping the second via contact in the vertical direction;

a source line contact passing through the lateral insulating spacer via the second through opening and contacting the second via contact;

a plate common source line covering the peripheral circuit structure with the lateral insulating spacer therebetween, the plate common source line having a bottom surface in contact with each of a top surface of the lateral insulating spacer and a top surface of the source line contact and comprising a third through opening overlapping the first via contact in the vertical direction;

an insulating plug filling the third through opening;

a memory stack structure comprising a plurality of gate lines overlapping each other in the vertical direction on the plate common source line; and a through contact apart from the source line contact in the lateral direction, the through contact being integrally connected to the first via contact by passing through at least one of the plurality of gate lines and the insulating plug in the vertical direction and passing through the lateral insulating spacer via the first through opening in the vertical direction, wherein a width of the first via contact is greater than a width of the insulating plug in the lateral direction, and wherein the first via contact and the second via contact comprise different materials from each other.

8. The semiconductor device of claim 7, wherein the second via contact, the source line contact, and the plate common source line comprise the same material as each other.

9. The semiconductor device of claim 7, wherein a width of the source line contact is greater than a width of the second via contact in the lateral direction.

10. The semiconductor device of claim 7, wherein the second via contact comprises a conductive barrier film and a contact plug having a bottom surface and a sidewall, which are surrounded by the conductive barrier film, and the source line contact has a bottom surface in contact with a top surface of the contact plug, and the contact plug and the source line contact have the same material as each other.

11. The semiconductor device of claim 7, wherein the first via contact is apart from the plate common source line with the lateral insulating spacer therebetween.

12. The semiconductor device of claim 7, wherein the first via contact and the second via contact are at the same vertical level.

13. The semiconductor device of claim 7, wherein the peripheral circuit structure further comprises a plurality of circuits connected to the plurality of wiring layers, the first via contact is connected to at least one of the plurality of circuits through the first wiring layer, and the second via contact is grounded through the second wiring layer.

14. The semiconductor device of claim 7, further comprising a channel structure passing through at least one of the plurality of gate lines and the plate common source line in the vertical direction, the channel structure comprising a portion in contact with the lateral insulating spacer.

15. The semiconductor device of claim 7, wherein the through contact comprises a memory cell contact, which is inside a vertical hole passing through at least one of the plurality of gate lines and connected to a selected one of the plurality of gate lines.

16. The semiconductor device of claim 7, wherein the through contact comprises a through-silicon via (TSV), the TSV is inside a vertical hole passing through at least one of the plurality of gate lines, and the TSV is apart from the plurality of gate lines in the lateral direction not to be connected to the plurality of gate lines.

17. An electronic system comprising:

a main substrate;

a semiconductor device on the main substrate; and a controller electrically connected to the semiconductor device on the main substrate, wherein the semiconductor device comprises:

a peripheral circuit structure comprising a plurality of circuits, a plurality of wiring layers, and a plurality of via contacts on the plurality of wiring layers, the plurality of via contacts being apart from each other in a lateral direction;

a plate common source line covering the peripheral circuit structure;

an insulating plug passing through the plate common source line in a vertical direction;

a lateral insulating spacer between the peripheral circuit structure and the plate common source line;

a memory stack structure comprising a plurality of gate lines overlapping each other in the vertical direction on the plate common source line;

a through contact passing through at least one of the plurality of gate lines and the insulating plug in the vertical direction, the through contact being connected to a first via contact selected from the plurality of via contacts;

a source line contact passing through the lateral insulating spacer in the vertical direction, the source line contact being between a second via contact selected from the plurality of via contacts and the plate common source line; and an input/output (I/O) electrically connectable to the peripheral circuit structure, wherein a width of the first via contact is greater than a width of the insulating plug in the lateral direction, wherein the main substrate further comprises wiring patterns configured to electrically connect the semiconductor device to the controller and, in the semiconductor device, the first via contact and the second via contact comprise different materials from each other.

\* \* \* \* \*